(12) United States Patent  
Saito et al.

(10) Patent No.: US 8,487,359 B2  
(45) Date of Patent: Jul. 16, 2013

(54) SPIN MOSFET AND RECONFIGURABLE LOGIC CIRCUIT USING THE SPIN MOSFET

(75) Inventors: Yoshiaki Saito, Kawasaki (JP); Hideyuki Sugiyama, Kawasaki (JP); Tomoaki Inokuchi, Kawasaki (JP); Mizue Ishikawa, Yokohama (JP); Takao Marukame, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 218 days.

(21) Appl. No.: 12/486,999

(22) Filed: Jun. 18, 2009

(65) Prior Publication Data

US 2010/0019798 A1    Jan. 28, 2010

(30) Foreign Application Priority Data

Jul. 24, 2008  (JP) .................................. 2008-191146

(51) Int. Cl.  
*H01L 27/108* (2006.01)

(52) U.S. Cl.  
USPC ............... 257/296; 438/3; 257/295; 257/421; 257/532; 365/49.13; 365/171; 365/158; 365/145

(58) Field of Classification Search  
USPC .... 257/295, 296, 421, 532; 438/3; 365/49.13, 365/171, 158, 145  
See application file for complete search history.

(56) References Cited

U.S. PATENT DOCUMENTS

| | | | | |
|---|---|---|---|---|
| 4,769,686 A | * | 9/1988 | Horiuchi et al. | ............... 257/373 |
| 5,303,182 A | * | 4/1994 | Nakao et al. | ................... 365/145 |
| 5,345,415 A | * | 9/1994 | Nakao et al. | ................... 365/145 |
| 5,495,117 A | * | 2/1996 | Larson | ........................... 257/295 |
| 5,536,672 A | * | 7/1996 | Miller et al. | ....................... 438/3 |
| 5,580,814 A | * | 12/1996 | Larson | ............................... 438/3 |
| 6,153,320 A | * | 11/2000 | Parkin | ......................... 428/811.2 |
| 6,256,223 B1 | | 7/2001 | Sun | |
| 6,381,171 B1 | * | 4/2002 | Inomata et al. | ............... 365/173 |

(Continued)

FOREIGN PATENT DOCUMENTS

| JP | 2006-93578 | 4/2006 |
|---|---|---|
| JP | 2006-286726 | 10/2006 |
| JP | 2007-88068 | 4/2007 |
| JP | 2008-66596 | 3/2008 |

OTHER PUBLICATIONS

Office Action issued Dec. 17, 2010, in Japan Patent Application No. 2008-191146 (with English-language Translation).  
U.S. Appl. No. 12/725,561, filed Mar. 17, 2010, Saito, et al.

(Continued)

*Primary Examiner* — Fernando L Toledo  
*Assistant Examiner* — Mohammed Shamsuzzaman  
(74) *Attorney, Agent, or Firm* — Oblon, Spivak, McClelland, Maier & Neustadt, L.L.P.

(57) ABSTRACT

It is made possible to provide a spin MOSFET that can minimize the increase in production costs and can perform both spin injection writing and reading. A spin MOSFET includes: a substrate that has a semiconductor region of a first conductivity type; first and second ferromagnetic stacked films that are formed at a distance from each other on the semiconductor region, and each have the same stacked structure comprising a first ferromagnetic layer, a nonmagnetic layer, and a second ferromagnetic layer stacked in this order, the second ferromagnetic stacked film having a film-plane area different from that of the first ferromagnetic stacked film; a gate insulating film that is formed on a portion of the semiconductor region, the portion being located between the first ferromagnetic stacked film and the second ferromagnetic stacked film; and a gate that is formed on the gate insulating film.

20 Claims, 34 Drawing Sheets

U.S. PATENT DOCUMENTS

| | | | |
|---|---|---|---|
| 6,753,562 B1 * | 6/2004 | Hsu et al. | 257/295 |
| 6,943,040 B2 * | 9/2005 | Min et al. | 438/3 |
| 7,020,013 B2 * | 3/2006 | Johnson | 365/158 |
| 7,045,841 B2 * | 5/2006 | Hong et al. | 257/295 |
| 7,148,531 B2 * | 12/2006 | Daughton et al. | 257/295 |
| 7,193,891 B2 * | 3/2007 | Johnson | 365/158 |
| 7,212,433 B2 * | 5/2007 | Johnson | 365/158 |
| 7,307,875 B2 * | 12/2007 | Johnson | 365/158 |
| 2004/0141259 A1 * | 7/2004 | Saito et al. | 360/324.11 |
| 2004/0251506 A1 * | 12/2004 | Johnson et al. | 257/421 |
| 2004/0257865 A1 * | 12/2004 | Honjo et al. | 365/171 |
| 2005/0226052 A1 * | 10/2005 | Horng et al. | 365/185.19 |
| 2005/0242382 A1 * | 11/2005 | Daughton et al. | 257/295 |
| 2006/0017081 A1 * | 1/2006 | Sun et al. | 257/295 |
| 2006/0043446 A1 * | 3/2006 | Fukada | 257/295 |
| 2006/0057745 A1 * | 3/2006 | Horng et al. | 438/3 |
| 2006/0227465 A1 * | 10/2006 | Inokuchi et al. | 360/324.1 |
| 2007/0069244 A1 * | 3/2007 | Datta et al. | 257/213 |
| 2007/0178608 A1 * | 8/2007 | Sun et al. | 438/3 |
| 2007/0221974 A1 * | 9/2007 | Celii et al. | 257/295 |
| 2007/0235782 A1 * | 10/2007 | Fukada | 257/295 |
| 2007/0281372 A1 * | 12/2007 | Takiguchi et al. | 438/3 |
| 2007/0284637 A1 * | 12/2007 | Fukada | 257/295 |
| 2008/0001194 A1 * | 1/2008 | Sakai et al. | 257/295 |
| 2008/0061332 A1 | 3/2008 | Saito et al. | |
| 2008/0121958 A1 * | 5/2008 | Izumi | 257/295 |
| 2008/0128682 A1 * | 6/2008 | Park | 257/40 |
| 2008/0128858 A1 * | 6/2008 | Nagai | 257/532 |
| 2008/0175032 A1 * | 7/2008 | Tanaka et al. | 365/51 |
| 2008/0191251 A1 * | 8/2008 | Ranjan et al. | 257/295 |
| 2008/0197391 A1 * | 8/2008 | Dote et al. | 257/295 |
| 2008/0258247 A1 * | 10/2008 | Mancoff et al. | 257/421 |
| 2009/0021975 A1 * | 1/2009 | Rao et al. | 365/145 |
| 2009/0046501 A1 * | 2/2009 | Ranjan et al. | 365/171 |
| 2009/0068763 A1 * | 3/2009 | Noda | 438/3 |
| 2009/0072286 A1 * | 3/2009 | Noda | 257/295 |
| 2009/0101954 A1 * | 4/2009 | Maruyama | 257/295 |
| 2009/0104718 A1 * | 4/2009 | Zhong et al. | 438/3 |
| 2009/0200592 A1 * | 8/2009 | Tsuchiaki et al. | 257/295 |
| 2009/0280577 A1 * | 11/2009 | Takamatsu et al. | 438/3 |
| 2010/0019348 A1 * | 1/2010 | Nagai | 257/532 |
| 2010/0022032 A1 * | 1/2010 | Takiguchi et al. | 438/3 |
| 2010/0047931 A1 * | 2/2010 | Nagai | 438/3 |
| 2010/0078693 A1 * | 4/2010 | Nakao | 257/295 |
| 2010/0078762 A1 * | 4/2010 | Wang | 257/532 |
| 2010/0244163 A1 * | 9/2010 | Daibou et al. | 257/421 |
| 2010/0264476 A1 * | 10/2010 | Fukada | 257/295 |
| 2011/0049592 A1 * | 3/2011 | Yoon et al. | 257/295 |

OTHER PUBLICATIONS

Satoshi Sugahara, et al., "A spin metal-oxide-semiconductor field-effect transistor using half-metallic-ferromagnet contacts for the source and drain", 2004 American Institute of Physics, Applied Physics Letters, vol. 84, No. 13, Mar. 29, 2004, pp. 2307-2309.

* cited by examiner

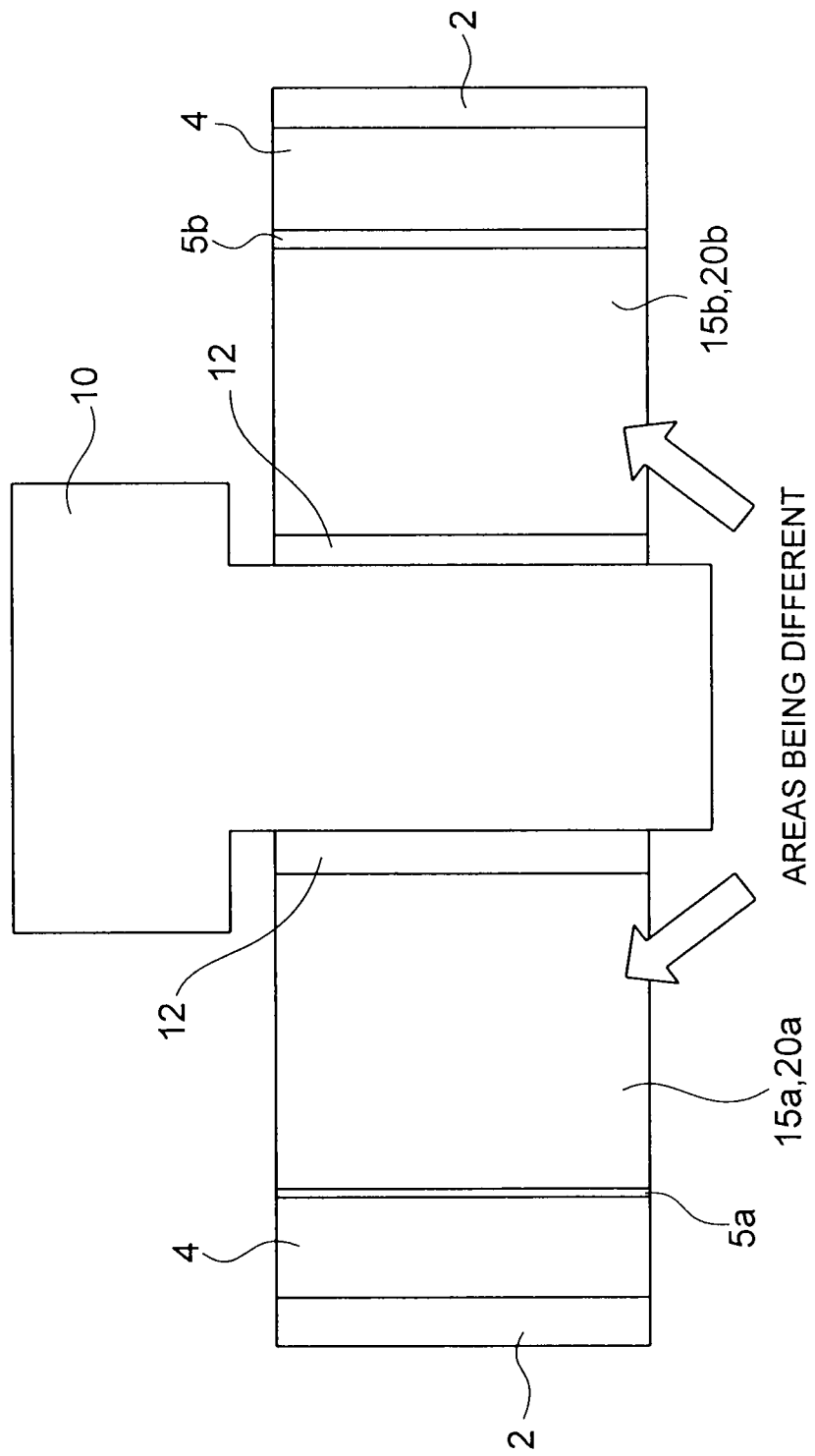

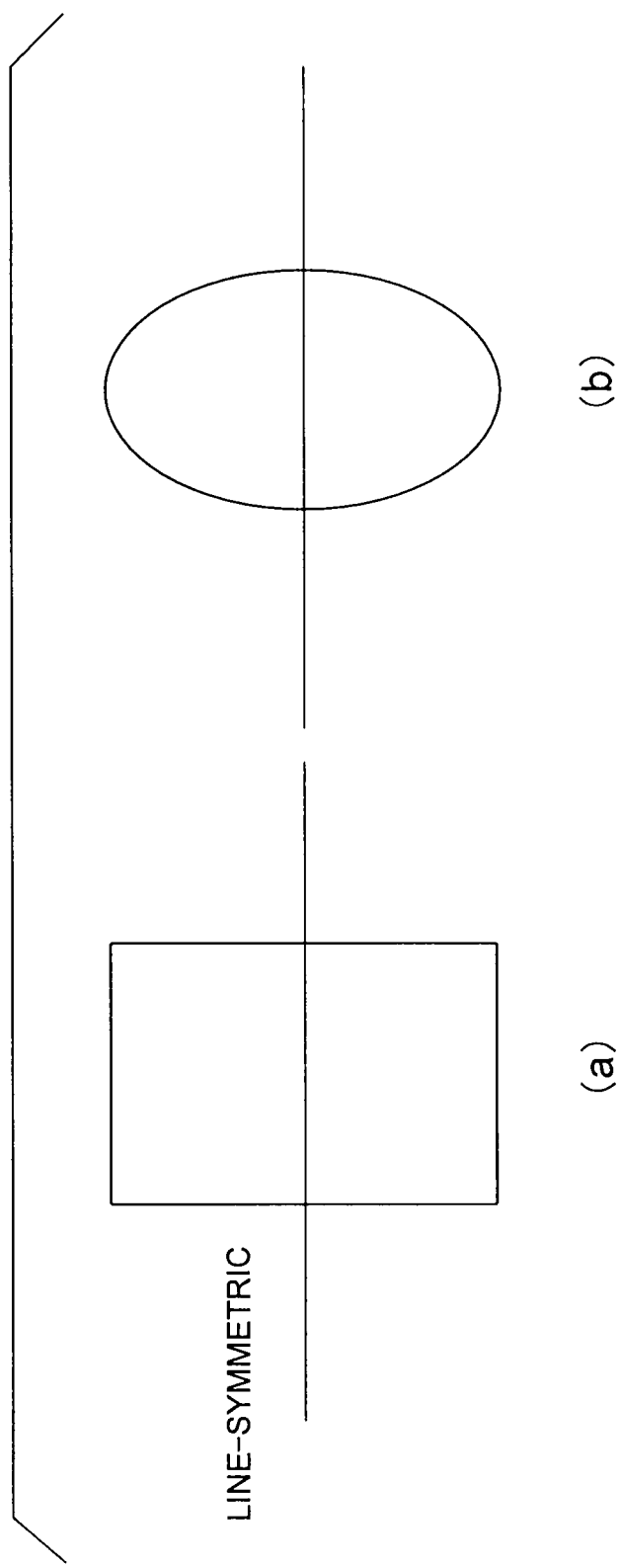

AND(MOSFET32;AP STATE)

| A | B | $V_{fg}$ | $V_1$ | $V_{out}$ |
|---|---|---|---|---|
| 0 | 0 | 0 | 1 | 0 |
| 1 | 0 | 1/2 | ~1 | 0 |
| 0 | 1 |  | ~1 | 0 |
| 1 | 1 | 1 | 0 | 1 |

FIG. 17

OR(MOSFET32;P STATE)

| A | B | $V_{fg}$ | $V_1$ | $V_{out}$ |
|---|---|---|---|---|
| 0 | 0 | 0 | 1 | 0 |
| 1 | 0 | 1/2 | ~0 | 1 |
| 0 | 1 |  | ~0 | 1 |
| 1 | 1 | 1 | 0 | 1 |

FIG. 18

SAMPLE 1

| CALCULATED AREA RATIO (SOURCE-UNIT MTJ AREA /DRAIN-UNIT MTJ AREA) | ACTUAL AREA RATIO (SOURCE-UNIT MTJ AREA /DRAIN-UNIT MTJ AREA) | FALSE OPERATIONS OBSERVED DURING 1000-TIME MEASUREMENT |
|---|---|---|
| 1.1 | 1.08 | 88 TIMES |
| 1.1 | 1.12 | NONE |
| 1.1 | 1.11 | NONE |
| 1.1 | 1.09 | 31 TIMES |
| 1.1 | 1.12 | NONE |
| 1.2 | 1.2 | NONE |
| 1.2 | 1.19 | NONE |
| 1.2 | 1.21 | NONE |
| 1.3 | 1.31 | NONE |
| 1.3 | 1.32 | NONE |
| 1.3 | 1.29 | NONE |
| 1.4 | 1.41 | NONE |
| 1.4 | 1.4 | NONE |
| 1.4 | 1.42 | NONE |
| 1.5 | 1.51 | NONE |
| 1.5 | 1.48 | NONE |
| 1.5 | 1.5 | NONE |

FIG. 24

SAMPLE 2

| CALCULATED AREA RATIO (SOURCE-UNIT MTJ AREA /DRAIN-UNIT MTJ AREA) | ACTUAL AREA RATIO (SOURCE-UNIT MTJ AREA /DRAIN-UNIT MTJ AREA) | FALSE OPERATIONS OBSERVED DURING 1000-TIME MEASUREMENT |
|---|---|---|
| 1.1 | 1.08 | 147 TIMES |
| 1.1 | 1.09 | 51 TIMES |
| 1.1 | 1.1 | NONE |
| 1.1 | 1.11 | NONE |
| 1.1 | 1.12 | NONE |
| 1.2 | 1.19 | NONE |
| 1.2 | 1.2 | NONE |
| 1.2 | 1.21 | NONE |
| 1.3 | 1.29 | NONE |
| 1.3 | 1.3 | NONE |
| 1.3 | 1.31 | NONE |
| 1.4 | 1.4 | NONE |
| 1.4 | 1.41 | NONE |
| 1.4 | 1.42 | NONE |
| 1.5 | 1.48 | NONE |
| 1.5 | 1.5 | NONE |
| 1.5 | 1.52 | NONE |

FIG. 25

SAMPLE 3

| CALCULATED AREA RATIO (SOURCE-UNIT MTJ AREA /DRAIN-UNIT MTJ AREA) | ACTUAL AREA RATIO (SOURCE-UNIT MTJ AREA /DRAIN-UNIT MTJ AREA) | FALSE OPERATIONS OBSERVED DURING 1000-TIME MEASUREMENT |
|---|---|---|
| 1.1 | 1.08 | 107 TIMES |
| 1.1 | 1.09 | 42 TIMES |
| 1.1 | 1.1 | NONE |
| 1.1 | 1.11 | NONE |
| 1.1 | 1.12 | NONE |
| 1.2 | 1.19 | NONE |
| 1.2 | 1.21 | NONE |
| 1.3 | 1.29 | NONE |
| 1.3 | 1.31 | NONE |
| 1.4 | 1.4 | NONE |
| 1.4 | 1.42 | NONE |
| 1.5 | 1.48 | NONE |
| 1.5 | 1.52 | NONE |

FIG. 26

SAMPLE 4

| CALCULATED AREA RATIO (SOURCE-UNIT MTJ AREA /DRAIN-UNIT MTJ AREA) | ACTUAL AREA RATIO (SOURCE-UNIT MTJ AREA /DRAIN-UNIT MTJ AREA) | FALSE OPERATIONS OBSERVED DURING 1000-TIME MEASUREMENT |
|---|---|---|
| 1.1 | 1.08 | 97 TIMES |
| 1.1 | 1.09 | 31 TIMES |
| 1.1 | 1.1 | NONE |
| 1.1 | 1.11 | NONE |
| 1.1 | 1.12 | NONE |
| 1.2 | 1.19 | NONE |
| 1.2 | 1.21 | NONE |
| 1.3 | 1.29 | NONE |
| 1.3 | 1.31 | NONE |
| 1.4 | 1.4 | NONE |
| 1.4 | 1.42 | NONE |
| 1.5 | 1.48 | NONE |
| 1.5 | 1.52 | NONE |

FIG. 27

SAMPLE 5

| CALCULATED AREA RATIO (SOURCE-UNIT MTJ AREA /DRAIN-UNIT MTJ AREA) | ACTUAL AREA RATIO (SOURCE-UNIT MTJ AREA /DRAIN-UNIT MTJ AREA) | FALSE OPERATIONS OBSERVED DURING 1000-TIME MEASUREMENT |
|---|---|---|
| 1.1 | 1.08 | 37 TIMES |
| 1.1 | 1.09 | 12 TIMES |
| 1.1 | 1.1 | NONE |
| 1.1 | 1.11 | NONE |
| 1.1 | 1.12 | NONE |
| 1.2 | 1.19 | NONE |
| 1.2 | 1.21 | NONE |
| 1.3 | 1.29 | NONE |
| 1.3 | 1.31 | NONE |
| 1.4 | 1.4 | NONE |
| 1.4 | 1.42 | NONE |
| 1.5 | 1.48 | NONE |
| 1.5 | 1.52 | NONE |

FIG. 28

SAMPLE 6

| CALCULATED AREA RATIO (SOURCE-UNIT MTJ AREA /DRAIN-UNIT MTJ AREA) | ACTUAL AREA RATIO (SOURCE-UNIT MTJ AREA /DRAIN-UNIT MTJ AREA) | FALSE OPERATIONS OBSERVED DURING 1000-TIME MEASUREMENT |
|---|---|---|
| 1.1 | 1.08 | 34 TIMES |
| 1.1 | 1.09 | 11 TIMES |
| 1.1 | 1.1 | NONE |
| 1.1 | 1.11 | NONE |
| 1.1 | 1.12 | NONE |
| 1.2 | 1.19 | NONE |
| 1.2 | 1.21 | NONE |
| 1.3 | 1.29 | NONE |
| 1.3 | 1.31 | NONE |
| 1.4 | 1.4 | NONE |
| 1.4 | 1.42 | NONE |
| 1.5 | 1.48 | NONE |
| 1.5 | 1.52 | NONE |

FIG. 29

SAMPLE 7

| CALCULATED AREA RATIO (SOURCE-UNIT MTJ AREA /DRAIN-UNIT MTJ AREA) | ACTUAL AREA RATIO (SOURCE-UNIT MTJ AREA /DRAIN-UNIT MTJ AREA) | FALSE OPERATIONS OBSERVED DURING 1000-TIME MEASUREMENT |
|---|---|---|
| 1.1 | 1.08 | 29 TIMES |
| 1.1 | 1.09 | 9 TIMES |
| 1.1 | 1.1 | NONE |
| 1.1 | 1.11 | NONE |
| 1.1 | 1.12 | NONE |
| 1.2 | 1.19 | NONE |
| 1.2 | 1.21 | NONE |
| 1.3 | 1.29 | NONE |
| 1.3 | 1.31 | NONE |
| 1.4 | 1.4 | NONE |
| 1.4 | 1.42 | NONE |
| 1.5 | 1.48 | NONE |
| 1.5 | 1.52 | NONE |

FIG. 30

SAMPLE 8

| CALCULATED AREA RATIO (SOURCE-UNIT MTJ AREA /DRAIN-UNIT MTJ AREA) | ACTUAL AREA RATIO (SOURCE-UNIT MTJ AREA /DRAIN-UNIT MTJ AREA) | FALSE OPERATIONS OBSERVED DURING 1000-TIME MEASUREMENT |
|---|---|---|
| 1.1 | 1.08 | 31 TIMES |
| 1.1 | 1.09 | 13 TIMES |
| 1.1 | 1.1 | NONE |
| 1.1 | 1.11 | NONE |
| 1.1 | 1.12 | NONE |
| 1.2 | 1.19 | NONE |
| 1.2 | 1.21 | NONE |
| 1.3 | 1.29 | NONE |
| 1.3 | 1.31 | NONE |
| 1.4 | 1.4 | NONE |
| 1.4 | 1.42 | NONE |
| 1.5 | 1.48 | NONE |
| 1.5 | 1.52 | NONE |

FIG. 31

SAMPLE 9

| CALCULATED AREA RATIO (SOURCE-UNIT MTJ AREA /DRAIN-UNIT MTJ AREA) | ACTUAL AREA RATIO (SOURCE-UNIT MTJ AREA /DRAIN-UNIT MTJ AREA) | FALSE OPERATIONS OBSERVED DURING 1000-TIME MEASUREMENT |
|---|---|---|
| 1.1 | 1.08 | 17 TIMES |
| 1.1 | 1.09 | 4 TIMES |
| 1.1 | 1.1 | NONE |
| 1.1 | 1.11 | NONE |
| 1.1 | 1.12 | NONE |
| 1.2 | 1.19 | NONE |
| 1.2 | 1.21 | NONE |
| 1.3 | 1.29 | NONE |
| 1.3 | 1.31 | NONE |
| 1.4 | 1.4 | NONE |
| 1.4 | 1.42 | NONE |
| 1.5 | 1.48 | NONE |
| 1.5 | 1.52 | NONE |

FIG. 32

SAMPLE 10

| CALCULATED AREA RATIO (SOURCE-UNIT MTJ AREA /DRAIN-UNIT MTJ AREA) | ACTUAL AREA RATIO (SOURCE-UNIT MTJ AREA /DRAIN-UNIT MTJ AREA) | FALSE OPERATIONS OBSERVED DURING 1000-TIME MEASUREMENT |
|---|---|---|
| 1.1 | 1.08 | 13 TIMES |
| 1.1 | 1.09 | 3 TIMES |
| 1.1 | 1.1 | NONE |
| 1.1 | 1.11 | NONE |
| 1.1 | 1.12 | NONE |
| 1.2 | 1.19 | NONE |
| 1.2 | 1.21 | NONE |
| 1.3 | 1.29 | NONE |
| 1.3 | 1.31 | NONE |
| 1.4 | 1.4 | NONE |
| 1.4 | 1.42 | NONE |
| 1.5 | 1.48 | NONE |
| 1.5 | 1.52 | NONE |

FIG. 33

SAMPLE 11

| CALCULATED AREA RATIO (SOURCE-UNIT MTJ AREA /DRAIN-UNIT MTJ AREA) | ACTUAL AREA RATIO (SOURCE-UNIT MTJ AREA /DRAIN-UNIT MTJ AREA) | FALSE OPERATIONS OBSERVED DURING 1000-TIME MEASUREMENT |
|---|---|---|
| 1.1 | 1.08 | 9 TIMES |
| 1.1 | 1.09 | 2 TIMES |
| 1.1 | 1.1 | NONE |
| 1.1 | 1.11 | NONE |
| 1.1 | 1.12 | NONE |
| 1.2 | 1.19 | NONE |
| 1.2 | 1.21 | NONE |
| 1.3 | 1.29 | NONE |
| 1.3 | 1.31 | NONE |
| 1.4 | 1.4 | NONE |
| 1.4 | 1.42 | NONE |
| 1.5 | 1.48 | NONE |
| 1.5 | 1.52 | NONE |

FIG. 34

SAMPLE 12

| CALCULATED AREA RATIO (SOURCE-UNIT MTJ AREA /DRAIN-UNIT MTJ AREA) | ACTUAL AREA RATIO (SOURCE-UNIT MTJ AREA /DRAIN-UNIT MTJ AREA) | FALSE OPERATIONS OBSERVED DURING 1000-TIME MEASUREMENT |
|---|---|---|
| 1.1 | 1.08 | 7 TIMES |
| 1.1 | 1.09 | 1 TIMES |
| 1.1 | 1.1 | NONE |
| 1.1 | 1.11 | NONE |
| 1.1 | 1.12 | NONE |
| 1.2 | 1.19 | NONE |
| 1.2 | 1.21 | NONE |
| 1.3 | 1.29 | NONE |
| 1.3 | 1.31 | NONE |
| 1.4 | 1.4 | NONE |
| 1.4 | 1.42 | NONE |
| 1.5 | 1.48 | NONE |
| 1.5 | 1.52 | NONE |

FIG. 35

SPIN MOSFET AND RECONFIGURABLE LOGIC CIRCUIT USING THE SPIN MOSFET

CROSS-REFERENCE TO RELATED APPLICATION

This application is based upon and claims the benefit of priority from prior Japanese Patent Application No. 2008-191146 filed on Jul. 24, 2008 in Japan, the entire contents of which are incorporated herein by reference.

BACKGROUND OF THE INVENTION

1. Field of the Invention

The present invention relates to a spin MOSFET and a reconfigurable logic circuit using the spin MOSFET.

2. Related Art

In recent years, devices having novel functions have been actively studied and developed. One example of such a device is a spin MOSFET having source and drain units formed with magnetic materials. The spin MOSFET is characterized in that the output properties can be controlled simply by reversing the spin moment of the magnetic material of at least one of the source and drain units. Taking advantage of this aspect, it is possible to form a spin MOSFET structure having a reconfigurable function and an amplifying function, or a reconfigurable logic circuit (see APL84 (2004) 2307, for example).

As a method for reversing the spin direction of a memory layer in an MRAM (Magnetic Random Access Memory), there has been a method for performing writing through spin injection (see U.S. Pat. No. 6,256,223, for example). It has been confirmed that the spin direction of a memory layer is reversed by applying a spin-polarized current into an MRAM through spin injection. To use this spin-injection writing method in a spin MOSFET, there has been a structure that has a ferromagnetic tunnel junction (hereinafter also referred to as MTJ (magnetic Tunnel Junction)) having a stacked structure formed with a ferromagnetic layer, an insulating layer, and a ferromagnetic layer in one of the source and drain regions (see JP-A 2008-66596 (KOKAI), for example). With the use of the structure disclosed in JP-A 2008-66596 (KOKAI), the MR ratio of the MTJ is added to the MR ratio achieved through the channel region. Accordingly, the structure has the advantages that the read output can be greatly increased, and a magnetization reversal can be performed through spin injection, since the MTJ is provided.

To realize the structure disclosed in JP-A 2008-66596 (KOKAI), however, it is necessary to prepare the source unit and the drain unit separately from each other. As a result, there is an increase in production costs.

SUMMARY OF THE INVENTION

The present invention has been made in view of these circumstances, and an object thereof is to provide a spin MOSFET that can minimize the increase in production costs and can perform both spin injection writing and reading, and a reconfigurable logic circuit that includes the spin MOSFET.

A spin MOSFET according to a first aspect of the present invention includes: a substrate that has a semiconductor region of a first conductivity type; first and second ferromagnetic stacked films that are formed at a distance from each other on the semiconductor region, and each have the same stacked structure comprising a first ferromagnetic layer, a nonmagnetic layer, and a second ferromagnetic layer stacked in this order, the second ferromagnetic stacked film having a film-plane area different from that of the first ferromagnetic stacked film; a gate insulating film that is formed on a portion of the semiconductor region, the portion being located between the first ferromagnetic stacked film and the second ferromagnetic stacked film; and a gate that is formed on the gate insulating film.

A reconfigurable logic circuit according to a second aspect of the present invention includes: a plurality of MOSFETs, at least one of the plurality of MOSFETs being the spin MOSFET according to the first aspect.

BRIEF DESCRIPTION OF THE DRAWINGS

FIG. 1B is a top view of the spin MOSFET according to the first embodiment;

FIGS. 7(a) and 7(b) are diagrams showing examples of line-symmetric shapes;

FIG. 17 is a logic table that is used in a case where the logic circuit of the seventh embodiment functions as an AND circuit;

FIG. 18 is a logic table that is used in a case where the logic circuit of the seventh embodiment functions as an OR circuit;

FIG. 24 is a diagram showing the results of experiments carried out on Sample 1;

FIG. 25 is a diagram showing the results of experiments carried out on Sample 2;

FIG. 26 is a diagram showing the results of experiments carried out on Sample 3;

FIG. 27 is a diagram showing the results of experiments carried out on Sample 4;

FIG. 28 is a diagram showing the results of experiments carried out on Sample 5;

FIG. 29 is a diagram showing the results of experiments carried out on Sample 6;

FIG. 30 is a diagram showing the results of experiments carried out on Sample 7;

FIG. 31 is a diagram showing the results of experiments carried out on Sample 8;

FIG. 32 is a diagram showing the results of experiments carried out on Sample 9;

FIG. 33 is a diagram showing the results of experiments carried out on Sample 10;

FIG. 34 is a diagram showing the results of experiments carried out on Sample 11; and FIG. 35 is a diagram showing the results of experiments carried out on Sample 12.

DETAILED DESCRIPTION OF THE INVENTION

The following is a description of embodiments of the present invention, with reference to the accompanying drawings. It should be noted here that the drawings are schematic, and the sizes of components and the size ratios between components differ from the actual ones. Also, the sizes and ratios of the same components might differ between drawings.

(First Embodiment)

Figure 1A:
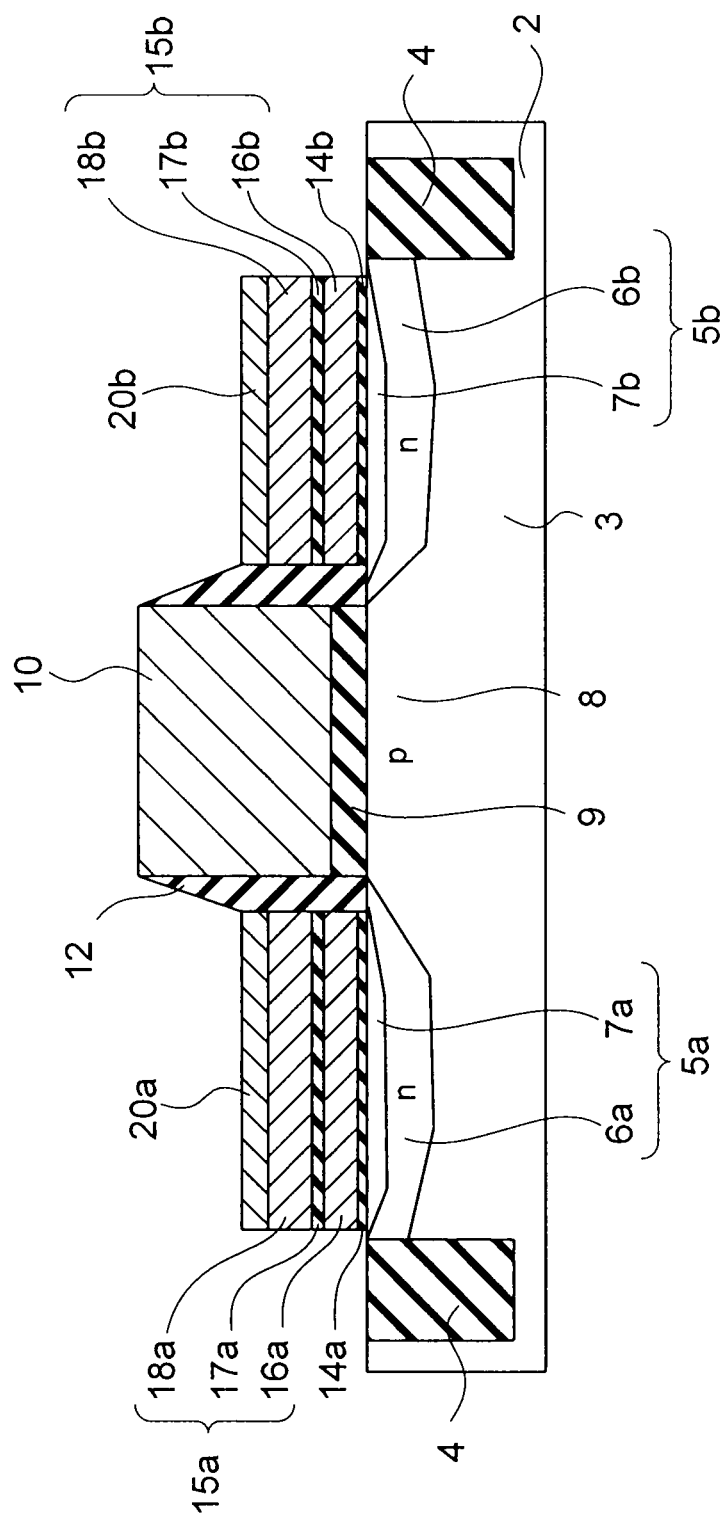
FIG. 1A is a cross-sectional view showing a spin MOSFET according to a first embodiment.

FIG. 1A is a cross-sectional view of a spin MOSFET in accordance with a first embodiment of the present invention, and FIG. 1B is a top view of the spin MOSFET. The spin MOSFET of this embodiment is an n-type spin MOSFET, and is formed in a device region 3 of a p-type semiconductor substrate 2. This device region 3 is a semiconductor region isolated by device isolating insulating films 4. The semiconductor region may be a part of the semiconductor substrate or a well region formed in the semiconductor substrate. Alternatively, the semiconductor region may be an SOI layer of an SOI substrate. In this specification, the device region 3 may be a semiconductor region that is a part of a p-type semiconductor substrate, or may be a p-well region formed in an n-type substrate. Alternatively, the device region 3 may be a p-type SOI layer of an SOI substrate. In the device region 3, n-type impurity diffusion regions 6a and 6b are formed at a distance from each other. On the surfaces of the n-type impurity diffusion region 6a and the n-type impurity diffusion region 6b, an $n^+$-impurity diffusion region 7a and an $n^+$-impurity diffusion region 7b having higher concentration than the n-type impurity diffusion region 6a and the n-type impurity diffusion region 6b are provided. The n-type impurity diffusion region 6a and the $n^+$-impurity diffusion region 7a form a source region 5, and the impurity diffusion region 6b and the $n^+$-impurity diffusion region 7b form a drain region 5b.

A gate insulating film 9 is formed on a portion of the semiconductor substrate 2. The portion is located between the source region 5a and the drain region 5b, and is to be a channel region 8. A gate 10 made of a nonmagnetic metal, for example, is formed on the gate insulating film 9. A source unit 15a is formed above the source region 5a, with a tunnel barrier 14a being interposed in between. A drain unit 15b is formed above the drain region 5b, with a tunnel barrier 14b being interposed in between. The source unit 15a has a ferromagnetic stacked structure (a ferromagnetic stacked film) that has a ferromagnetic layer 16a, a nonmagnetic layer 17a, and a ferromagnetic layer 18a stacked in this order. The drain unit 15b has a ferromagnetic stacked structure (a ferromagnetic stacked film) that has a ferromagnetic layer 16b, a nonmagnetic layer 17b, and a ferromagnetic layer 18b stacked in this order. In a case where the nonmagnetic layers 17a and 17b are tunnel barriers, the source unit 15a and the drain unit 15b form a ferromagnetic tunnel junction (MTJ (Magnetic Tunnel Junction)). The ferromagnetic stacked films are also referred to as MTJ stacked films in this specification.

In this embodiment, the ferromagnetic layers 16a and 16b located on the side closer to the semiconductor substrate 2 are free layers of which magnetization directions are variable, and the ferromagnetic layers 18a and 18b located on the side farther away from the semiconductor substrate 2 are magnetization fixed layers of which magnetization directions are fixed. It is preferable that an antiferromagnetic layer is attached to each magnetization fixed layer, and the magnetization of each magnetization fixed layer is fixed by the antiferromagnetic layer, as will be described in the later described second or third modifications. In this embodiment, the magnetization directions of the ferromagnetic layer 16a and the ferromagnetic layer 18a are parallel to the film plane, and the magnetization directions of the ferromagnetic layer 16b and the ferromagnetic layer 18b are also parallel to the film plane. In this specification, the "film plane" means the upper face of each stacked film.

A nonmagnetic metal layer 20a and a nonmagnetic metal layer 20b are provided on the source unit 15a and the drain unit 15b, respectively. The source unit 15a and the nonmagnetic metal layer 20a are insulated from the gate 10 by a gate sidewall 12 made of an insulating material, and the drain unit 15b and the nonmagnetic metal layer 20b are insulated from the gate 10 by a gate sidewall 12 made of an insulating material.

In the spin MOSFET of this embodiment, the film planes of the source unit 15a and the drain unit 15b of the ferromagnetic stacked films stacked above the source region 5a and the drain region 5b have different areas from each other. Accordingly, only the free layers of the ferromagnetic stacked film of the smaller area can be reversed at the time of spin injection writing. The write current $I_c$ generated at the time of spin injection writing can be expressed by the following equation:

$$I_c = 2e\alpha MAt[H_k + H_d/2]/(\hbar g) \quad (1)$$

Here, e represents the elementary charge, α represents the Gilbert damping parameter, M represents the magnetization, A represents the area of the film plane of the magnetic recording layer (free layer), t represents the film thickness of the magnetic recording layer (free layer), $H_d$ represents the demagnetic field, $H_k$ represents the anisotropic constant, and h represents the Planck's constant. Meanwhile, g represents the spin dependent efficiency g(θ) at the interface between the magnetization fixed layer and a nonmagnetic field, and is expressed by the following equation:

$$g(\theta) = [-4 + (1+p)^3(3+\cos\theta)/4p^{3/2}]^{-1} \quad (2)$$

Here, p represents the spin polarization rate, and θ represents the angle between the two magnetic layers. In other words, the current for causing the free layer to have a spin reversal is proportional to the area of the film plane of the ferromagnetic stacked film. In this embodiment, a spin reversal is to be caused in the free layer of the ferromagnetic stacked film of either the source unit or the drain unit. Therefore, the film planes of the ferromagnetic stacked films of the source unit and the drain unit have different areas from each other, and the magnetization of the free layer of the ferromagnetic stacked film having the smaller area is reversed first. It is preferable that the area ratio is 1.1 or higher, and it is more preferable that the area ratio is 1.2 or higher, as will be described in Examples.

Although the film plane of the ferromagnetic stacked film of the source unit 15a has the larger area in this embodiment, the film plane of the ferromagnetic stacked film of the drain unit 15b may have the larger area. It is preferable that the spin directions of the free layer and the ferromagnetic layer in contact with the nonmagnetic layer (the tunnel barrier) of the magnetization fixed layer of the ferromagnetic stacked film having the larger area are parallel to each other. The layers of the ferromagnetic stacked film having the larger area are designed to lie in the same direction, so that writing is not performed when the spin direction of the free layer of the ferromagnetic stacked film having the smaller area is rewritten. As the spin directions are parallel to each other at that point, the resistance of the spin MOSFET of this embodiment can be made lower, and spin injection writing can be performed at a higher speed.

As described above, at the time of writing, such a current is generated in the spin MOSFET that the magnetization direction of the free layer of the ferromagnetic stacked film having the larger area between the source unit 15a and the drain unit 15b is not changed, but the magnetization direction of the free layer of the ferromagnetic stacked film having the smaller area is reversed. At the time of reading, such a current is applied to the spin MOSFET that the magnetization directions of the free layers of the ferromagnetic stacked films of the source unit 15a and the drain unit 15b are not changed. As disclosed in JP-A 2008-66596 (KOKAI), a predetermined first voltage is applied to the gate 10, and a current is applied between the source unit 15a and the drain unit 15b via the channel 8. In this manner, the electric resistance between the source unit 15a and the drain unit 15b is measured, and reading is performed. Writing can be performed by applying a predetermined second voltage different from the voltage applied at the time of reading to the gate 10, and applying a current between the source unit 15a and the drain unit 15b via the channel 8.

In this embodiment, the film planes of the source unit 15a and the drain unit 15b have different areas from each other. However, the source unit 15a and the drain unit 15b have the same stacked structures. Thus, the increase in production costs can be minimized.

In this embodiment, the spin MOSFET is an n-MOSFET. In other words, an n-p-n junction is formed on a semiconductor substrate. The high-concentration $n^+$-impurity diffusion layers 7a and 7b are formed on the substrate surfaces of the source region 5a and the drain region 5b. The $n^+$-impurity diffusion layers 7a and 7b can be formed by injecting impurities by an ion implanting technique as in a case where a conventional MOS transistor is formed, and performing annealing by RTA (Rapid Thermal Annealing). When a p-MOSFET is formed instead of an n-MOSFET, a p-n-p junction is formed with impurities of the opposite conductivity from the impurities used in the case of an n-p-n junction, and high-concentration impurity diffusion regions ($p^+$-impurity diffusion regions) are formed on the substrate surfaces of the source region and the drain region. By forming $p^+$-impurity diffusion regions or $n^+$-impurity diffusion regions, the interfacial resistance is made lower, and a spin MOSFET that can perform spin injection writing at a higher speed can be formed.

(First Modification)

Figure 2:
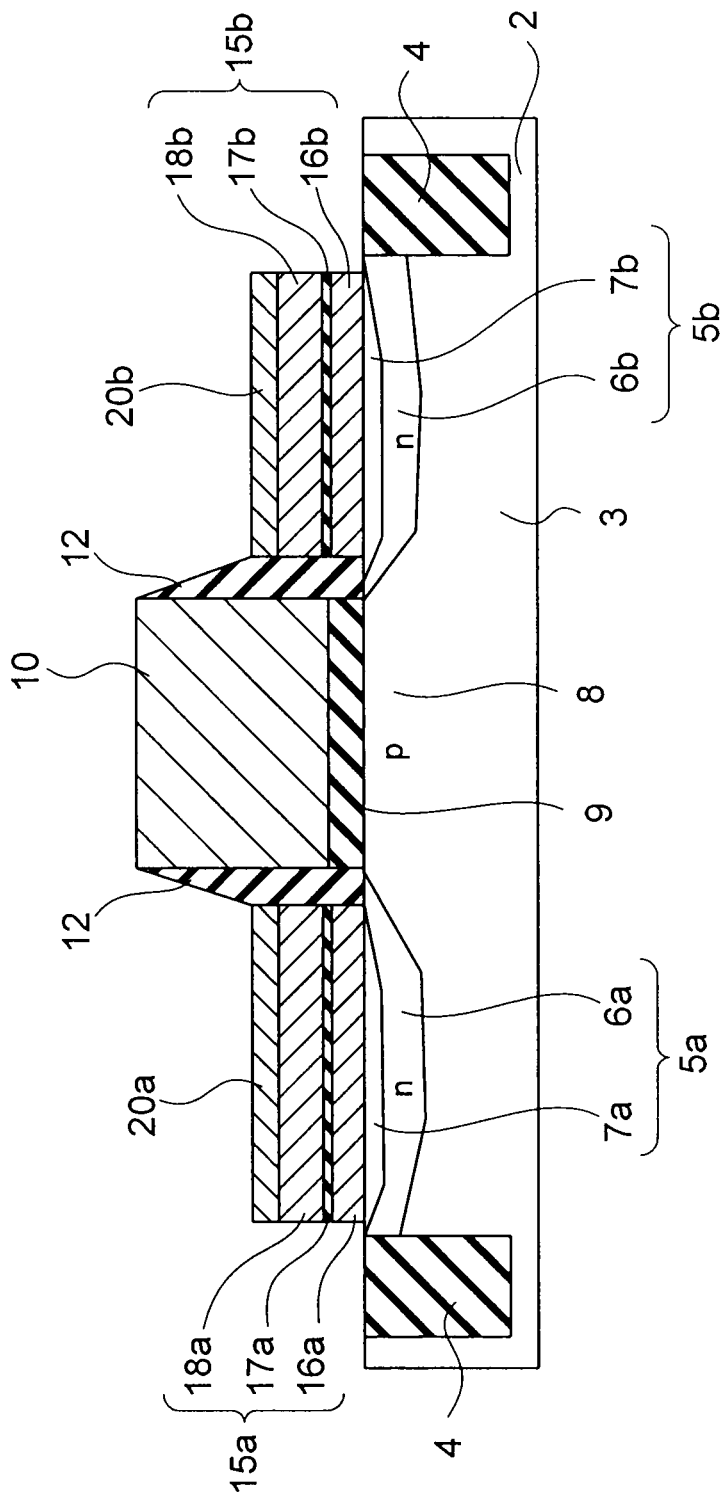
FIG. 2 is a cross-sectional view showing the spin MOSFET according to a first modification of the first embodiment.

FIG. 2 shows a spin MOSFET in accordance with a first modification of the first embodiment. FIG. 2 is a cross-sectional view of the spin MOSFET in accordance with the first modification. The spin MOSFET of this modification is the same as the spin MOSFET of the first embodiment shown in FIGS. 1A and 1B, except that the tunnel barrier 14a between the source unit 15a and the source region 5a, and the tunnel barrier 14b between the drain unit 15b and the drain region 5b are eliminated. In other words, the ferromagnetic stacked films 15a and 15b are placed directly on the source region 5a and the drain region 5b of the MOSFET. In this case, a Schottky barrier spontaneously appears at each interface between the ferromagnetic stacked films 15a and 15b, and the source region 5a and the drain region 5b.

The spin MOSFET of this modification can perform spin injection writing at a higher speed, like the spin MOSFET of the first embodiment. Also, the increase in production costs can be minimized.

(Second Modification)

Figure 3:
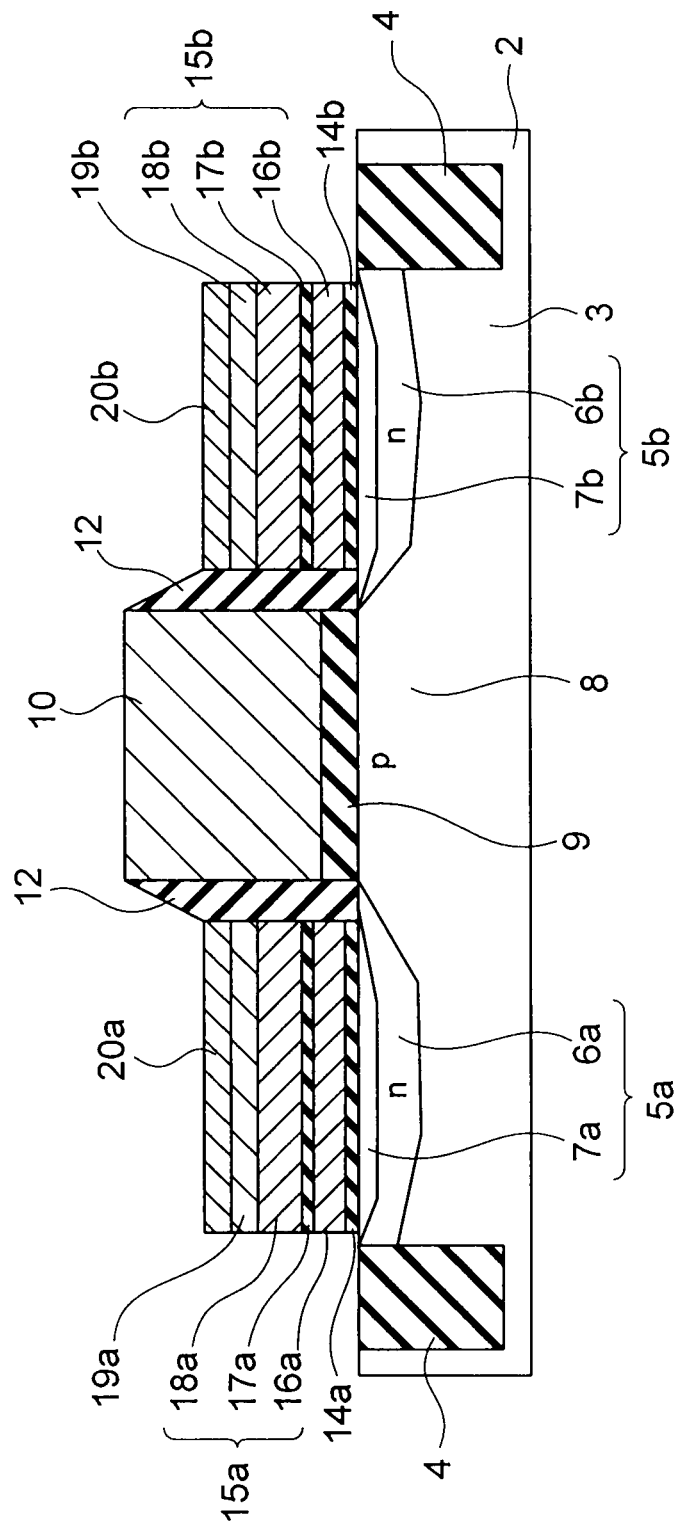
FIG. 3 is a cross-sectional view showing the spin MOSFET according to a second modification of the first embodiment.

FIG. 3 shows a spin MOSFET in accordance with a second modification of the first embodiment. FIG. 3 is a cross-sectional view of the spin MOSFET in accordance with the second modification. The spin MOSFET of this modification is the same as the spin MOSFET of the first embodiment shown in FIGS. 1A and 1B, except that an antiferromagnetic layer 19a that fixes the magnetization of the ferromagnetic layer 18a as a magnetization fixed layer is provided between the source unit 15a and the nonmagnetic metal layer 20a, and an antiferromagnetic layer 19b that fixes the magnetization of the ferromagnetic layer 18b as a magnetization fixed layer is provided between the drain unit 15b and the nonmagnetic metal layer 20b.

The spin MOSFET of this modification can perform spin injection writing at a higher speed, like the spin MOSFET of the first embodiment. Also, the increase in production costs can be minimized.

(Third Modification)

Figure 4:
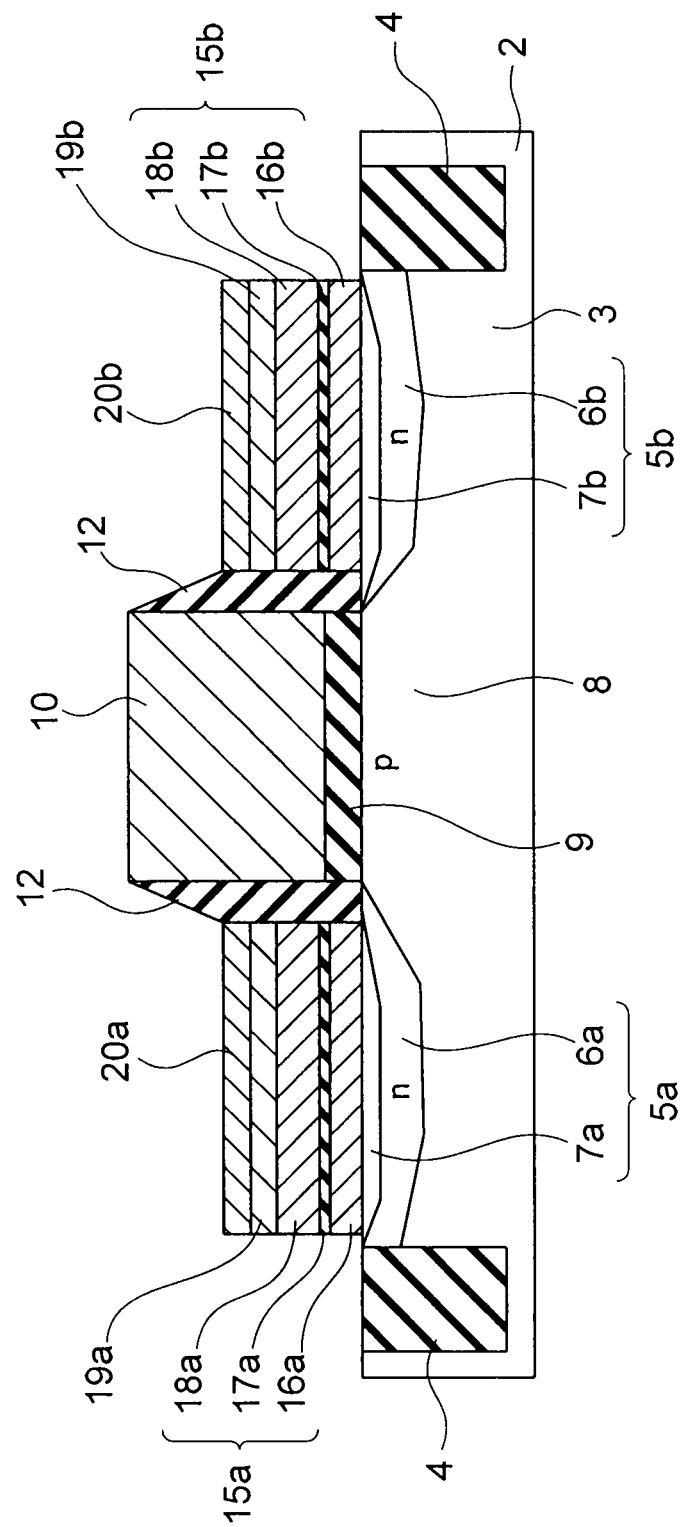
FIG. 4 is a cross-sectional view showing the spin MOSFET according to a third modification of the first embodiment.

FIG. 4 shows a spin MOSFET in accordance with a third modification of the first embodiment. FIG. 4 is a cross-sectional view of the spin MOSFET in accordance with the third modification. The spin MOSFET of this modification is the same as the spin MOSFET of the first modification shown in FIG. 2, except that an antiferromagnetic layer 19a is provided between the source unit 15a and the nonmagnetic metal layer 20a, and an antiferromagnetic layer 19b is provided between the drain unit 15b and the nonmagnetic metal layer 20b. The antiferromagnetic layer 19a fixes the magnetization of the ferromagnetic layer 18a as a magnetization fixed layer. The ferromagnetic layer 19b fixes the magnetization of the ferromagnetic layer 18b as a magnetization fixed layer.

The spin MOSFET of this modification can perform spin injection writing at a higher speed, like the spin MOSFET of the first embodiment. Also, the increase in production costs can be minimized. Furthermore, a Schottky barrier spontaneously appears at each interface between the ferromagnetic stacked films 15a and 15b, and the source region 5a and the drain region 5b.

(Second Embodiment)

Figure 5A:
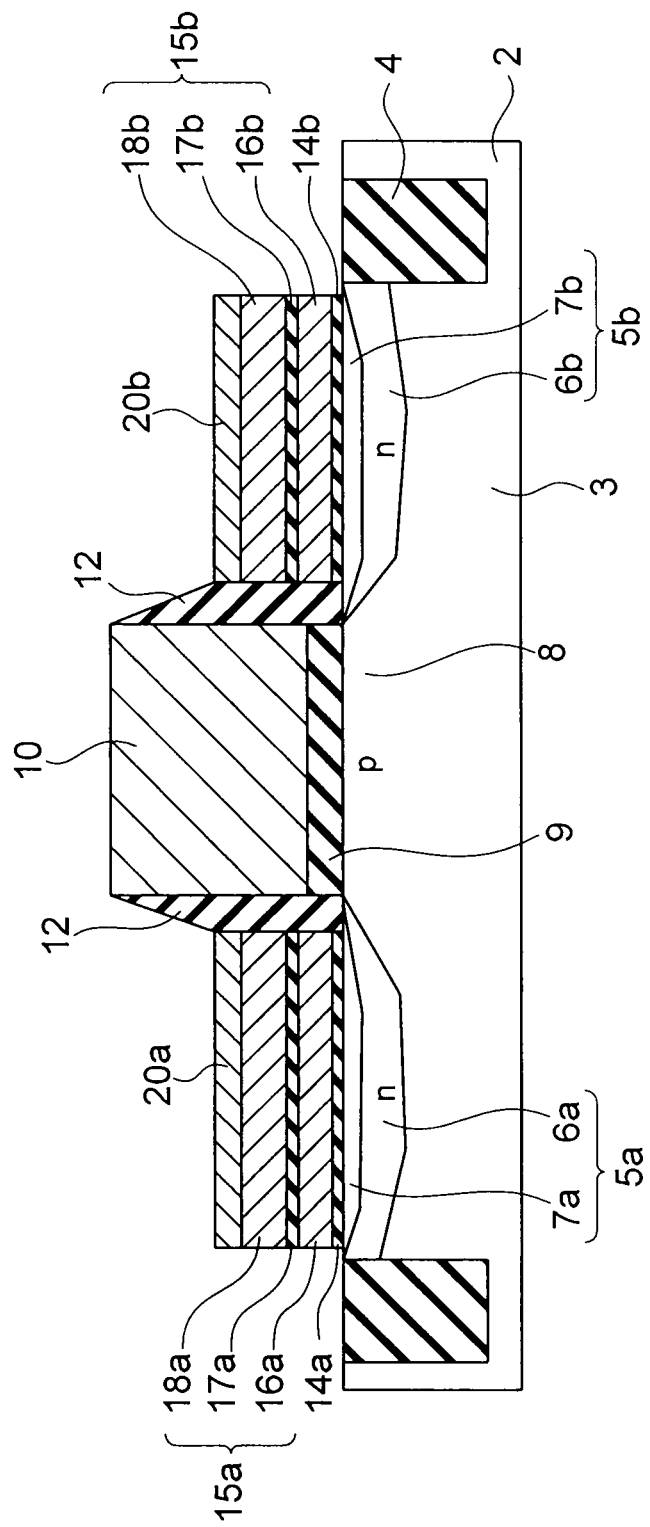
FIG. 5A is a cross-sectional view showing a spin MOSFET according to a second embodiment.
Figure 5B:
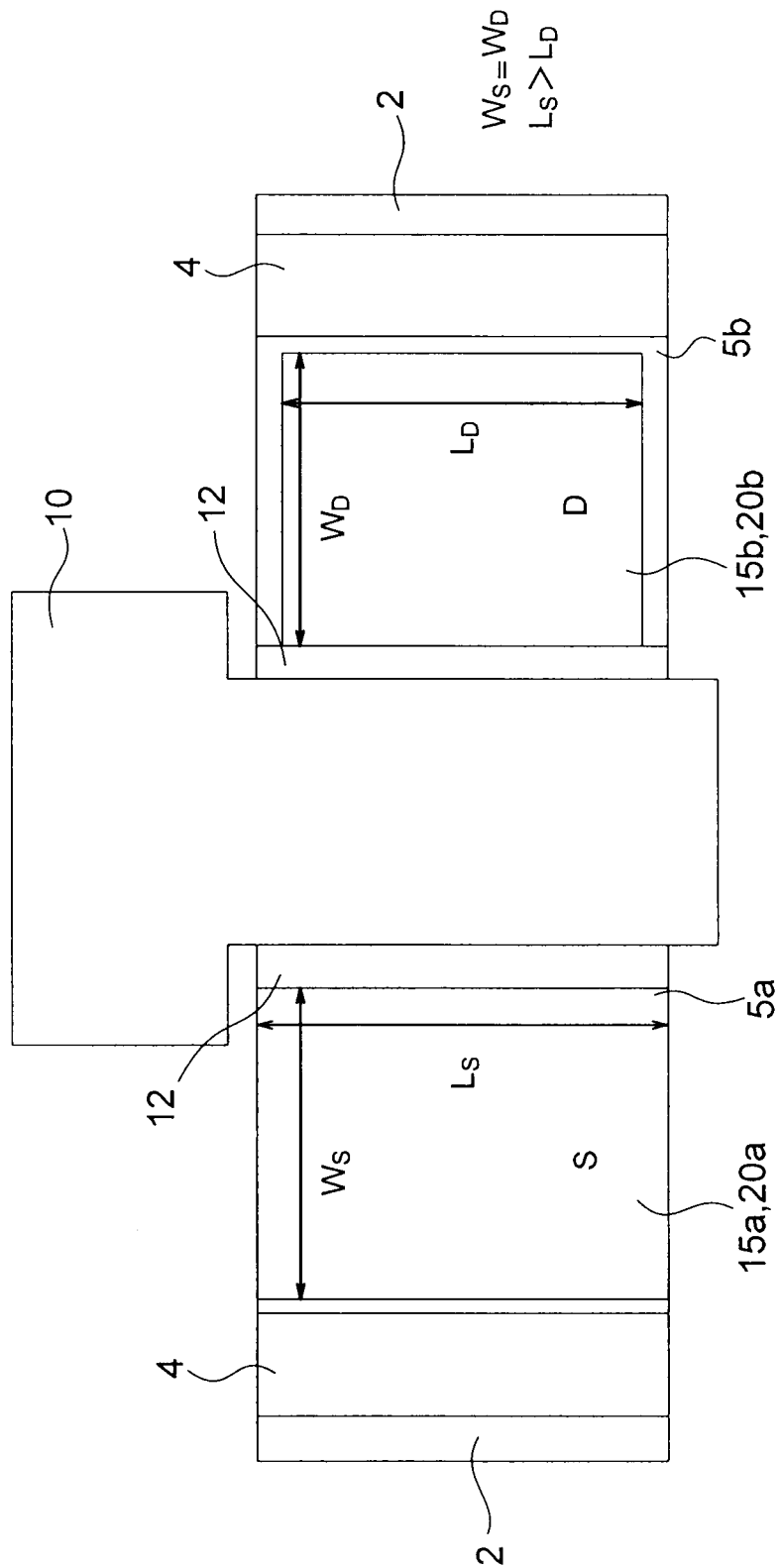
FIG. 5B is a top view of the spin MOSFET according to the second embodiment.

FIG. 5A is a cross-sectional view of a spin MOSFET in accordance with a second embodiment of the present invention. FIG. 5B is a top view of the spin MOSFET in accordance with the second embodiment.

The spin MOSFET of this embodiment is the same as the spin MOSFET of the first embodiment shown in FIGS. 1A and 1B, except that the width $W_S$ of the source unit 15a and the width $W_D$ of the drain unit 15b are the same, and the length $LW_S$ of the source unit 15a is made smaller than the length $L_D$ of the drain unit 15b (see FIG. 5B), so that the area of the film plane of the source unit 15a becomes smaller than the area of the film plane of the drain unit 15b. The ferromagnetic stacked films of the source unit 15a and the drain unit 15b have different film plane sizes, but have the same layer stacked structures.

As described above, the ferromagnetic films of the source unit 15a and the drain unit 15b have different sizes so as to have different film-plane areas. In this manner, a wider margin is allowed at the time of spin injection writing. This is probably because not only the area A of the ferromagnetic layers but also the anisotropic magnetic field $H_k$ is changed by setting the widths at the same value ($W_S=W_D$) and varying only the lengths. Accordingly, the write current $I_c$ is affected at the time of spin injection writing, as can be seen from the equation (1) shown in the first embodiment, and the margin becomes wider. In this case, it is preferable that the length ratio between the ferromagnetic films of the source unit 15a and the drain unit 15b ($=L_S/L_D$) is 1.1 or higher, and it is more preferable that the length ratio is 1.2 or higher.

In this embodiment, the increase in production costs can be minimized, and spin injection writing and reading can be performed, as in the first embodiment. Also, as in the first embodiment, the high-concentration $n^+$-impurity diffusion layers 7a and 7b are formed on the substrate surfaces of the source region 5a and the drain region 5b. Accordingly, spin injection writing can be performed at a higher speed. In this embodiment, the area of the film plane of the source unit 15a is made larger than the area of the film plane of the drain unit 15b. However, the area of the film plane of the source unit 15a may be made smaller than the area of the film plane of the drain unit 15b. It is preferable that the film-plane area ratio between the source unit 15a and the drain unit 15b is 1.1 or higher, and it is more preferable that the film-plane area ratio is 1.2 or higher.

It is of course possible to apply this embodiment to the first through third modifications of the first embodiment.

(Third Embodiment)

Figure 6A:
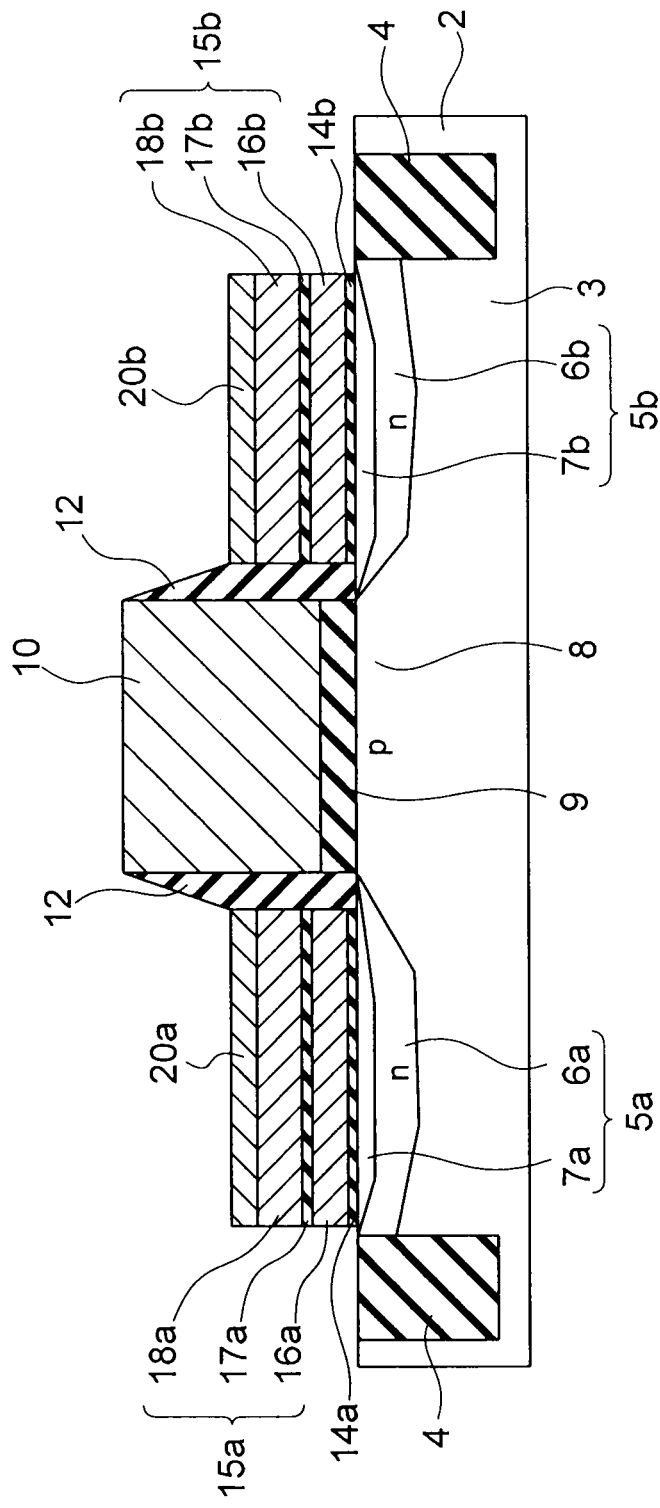
FIG. 6A is a cross-sectional view showing a spin MOSFET according to a third embodiment.
Figure 6B:
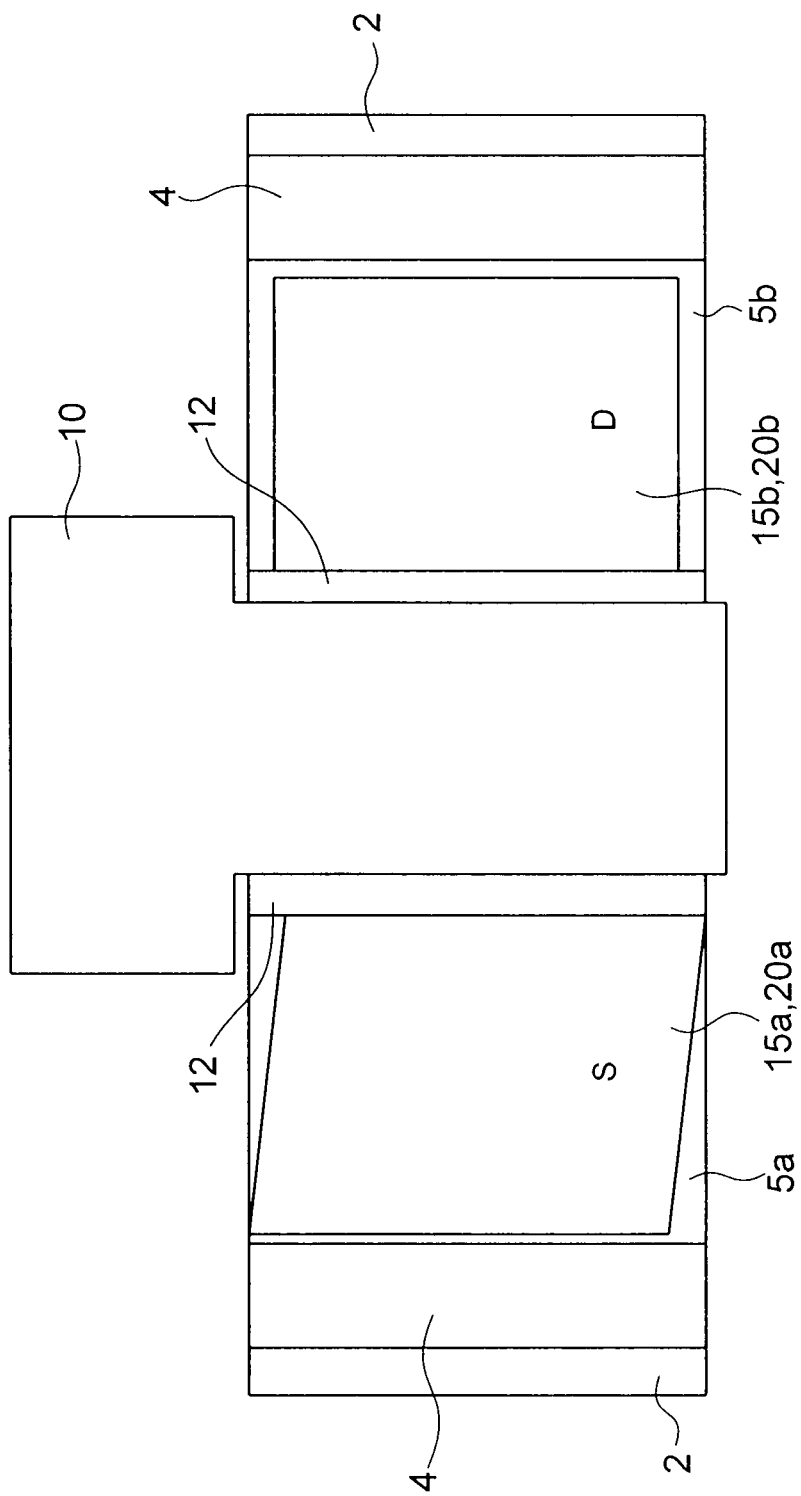
FIG. 6B is a top view of the spin MOSFET according to the third embodiment.

FIG. 6A is a cross-sectional view of a spin MOSFET in accordance with a third embodiment of the present invention. FIG. 6B is a top view of the spin MOSFET in accordance with the third embodiment. The spin MOSFET of this embodiment is the same as the spin MOSFET of the first embodiment shown in FIGS. 1A and 1B, except that the film plane of the ferromagnetic stacked film of the source unit 15a has a different shape. As shown in FIG. 6B, the film plane of the ferromagnetic stacked film of the source unit 15a has a line-asymmetric shape, and the film plane of the ferromagnetic stacked film of the drain unit 15b has a line-symmetric shape (a shape that has at least one axis of symmetry). In this specification, a "line-asymmetric" shape is a shape that is not line-symmetric. In this embodiment, the film plane of the ferromagnetic stacked film of the source unit 15a has a line-asymmetric shape, and the film plane of the ferromagnetic stacked film of the drain unit 15b has a line-symmetric shape. However, the film plane of the ferromagnetic stacked film of the source unit 15a may have a line-symmetric shape, and the film plane of the ferromagnetic stacked film of the drain unit 15b may have a line-asymmetric shape. It goes without saying that the film planes of the ferromagnetic stacked films of the source unit 15a and the drain unit 15b have different areas from each other.

Figure 8:
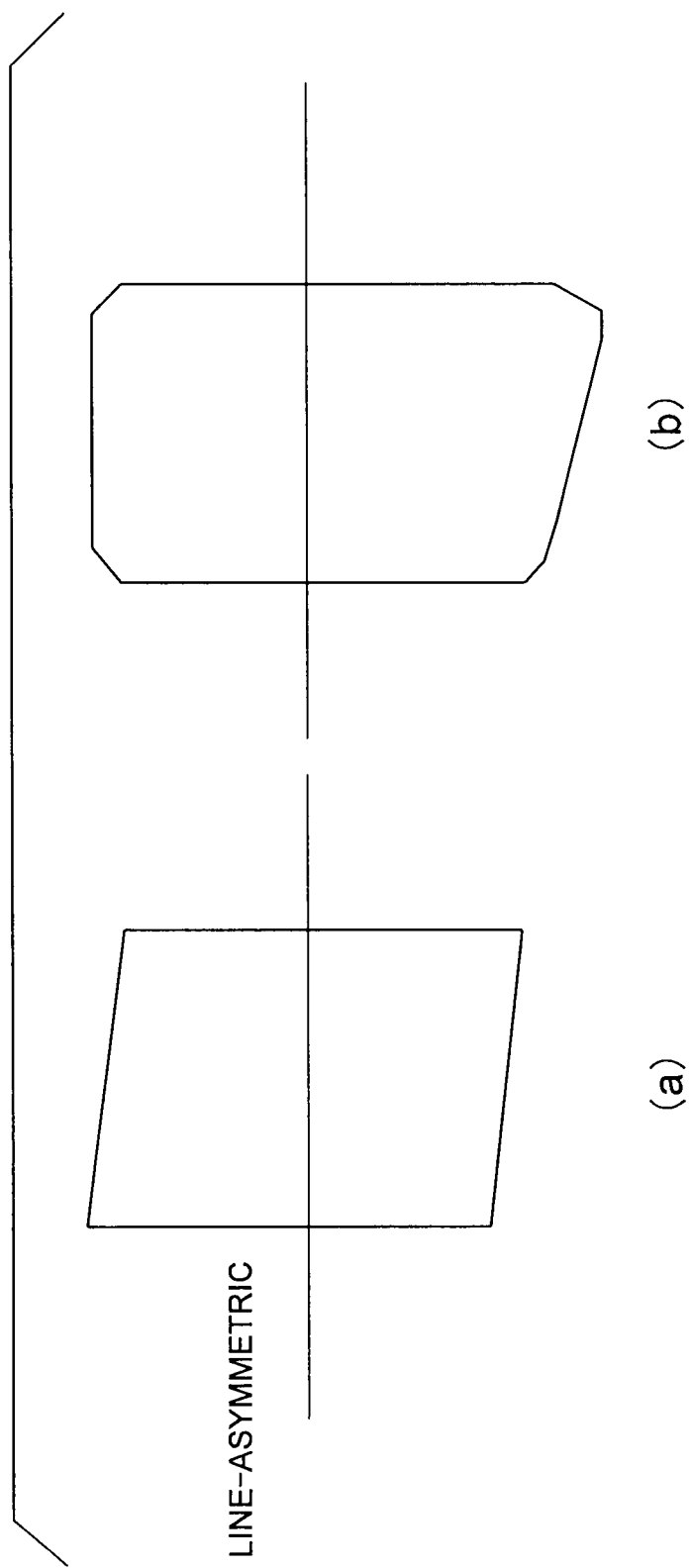
FIGS. 8(a) and 8(b) are diagrams showing examples of line-asymmetric shapes.

As described above, one of the source unit 15a and the drain unit 15b has a line-symmetric shape, while the other one has a line-asymmetric shape. Accordingly, a wider margin is allowed at the time of spin injection writing. FIGS. 7(a) and 7(b) show examples of line-symmetric shapes. FIGS. 8(a) and 8(b) show examples of line-asymmetric shapes. The shapes shown in FIGS. 7(a) and 7(b) are a rectangular shape and an elliptic shape. The shape shown in FIG. 8(a) is a parallelogram, and the shape shown in FIG. 8(b) is a trapezium, with the corner portions being cut off. The film planes of the source unit 15a and the drain unit 15b can have not only the shapes of those examples but also any line-symmetric or line-asymmetric shapes. In that case, it is preferable that the length ratio between the ferromagnetic stacked films is 1.1 or higher, and it is more preferable that the length ratio between the ferromagnetic stacked films is 1.2 or higher, as mentioned in the second embodiment.

In this embodiment, the increase in production costs can be minimized, and spin injection writing and reading can be performed, as in the first embodiment. Also, as in the first embodiment, the high-concentration $n^+$-impurity diffusion layers 7a and 7b are formed on the substrate surfaces of the source region 5a and the drain region 5b. Accordingly, spin injection writing can be performed at a higher speed.

In this embodiment, the area of the film plane of the source unit 15a is made larger than the area of the film plane of the drain unit 15b. However, the area of the film plane of the source unit 15a may be made smaller than the area of the film plane of the drain unit 15b.

It is of course possible to apply this embodiment to the first through third modifications of the first embodiment.

In the first through third embodiments and their modifications, the semiconductor substrate 2 may be an Si substrate, a Ge substrate, a GaAs substrate, or the like.

In the first through third embodiments and the modifications, the source region 5a and the drain region 5b are provided. However, in a case where there is not a large difference in electric conductivity between the semiconductor substrate and the magnetic material, it is not necessary to prepare the source region 5a and the drain region 5b. In a case where there is a large difference in electric conductivity between the magnetic material and the semiconductor substrate, the problem of conductance mismatching is caused, and the spin polarization reaches saturation. The polarized spins cannot be injected into the semiconductor substrate. To solve this problem, it is preferable that ion implantation into the semiconductor substrate is performed, and a source region and a drain region that have a different conductivity type from the semiconductor substrate are provided, as in a conventional MOSFET. In this manner, a p-n junction is formed. At this point, it is preferable that high-concentration impurity diffusion regions are formed at the interface between the semiconductor substrate and the magnetic material or the tunnel barrier by injecting high-concentration ions into the semiconductor substrate and segregating $n^+$-ions or $p^+$-ions. More specifically, in an n-type MOSFET or a p-type MOSFET using a semiconductor 0substrate made of Si or Ge, it is preferable that B (boron) ions are injected as p-type impurities, and P (phosphorus) and As (arsenic) ions are injected as n-type impurities. In a case where the substrate is a GaAs substrate, the mobility of an n-type MOSFET is high and therefore preferable. In such a case, doping with Si is normally performed. It is preferable that high-concentration ion implantation is performed on the $n^+$-impurity diffusion region and the $p^+$-impurity diffusion region, with the element acceleration being as low as 20 KeV or less. In a case where the substrate is an Si substrate, it is possible to inject the same n-type impurity element into the n-type impurity diffusion region and the n⁺-impurity diffusion region. In a case where the substrate is a Ge substrate, however, it is preferable that P (phosphorus) and As (arsenic) are used in the n-type impurity diffusion region, and S (sulfur) is used in the n⁺-impurity diffusion region, so as to lower the resistance and achieve a high-speed device. After ion implantation, RTA is performed in an $N_2$ atmosphere. The temperature for the RTA is 1000° C. to 1100° C. in the case of an Si substrate, and is 400° C. to 500° C. in the case of a Ge substrate. In the case of a GaAs substrate, RTA is performed in an As atmosphere at 300° C. to 600° C., or Si doping is performed to grow a film at the time of film formation. In any case, an excellent MOSFET can be formed, and spin dependent conduction is observed.

In a case where a Ge substrate is used, and tunnel barriers made of MgO are formed on n-type source and drain regions, it is preferable that a $GeO_x$ film or a $GeN_x$ film of 1 to 3 nm in film thickness is provided at each interface between the substrate and MgO. With the $GeO_x$ film or the $GeN_x$ film, the resistance between the substrate and MgO can be lowered. In this case, it is also preferable that n⁺-impurity diffusion regions are prepared. By providing the n⁺-impurity diffusion regions, the interfacial resistance can be reduced, and spin injection writing can be performed at a higher speed.

(Fourth Embodiment)

Figure 9:
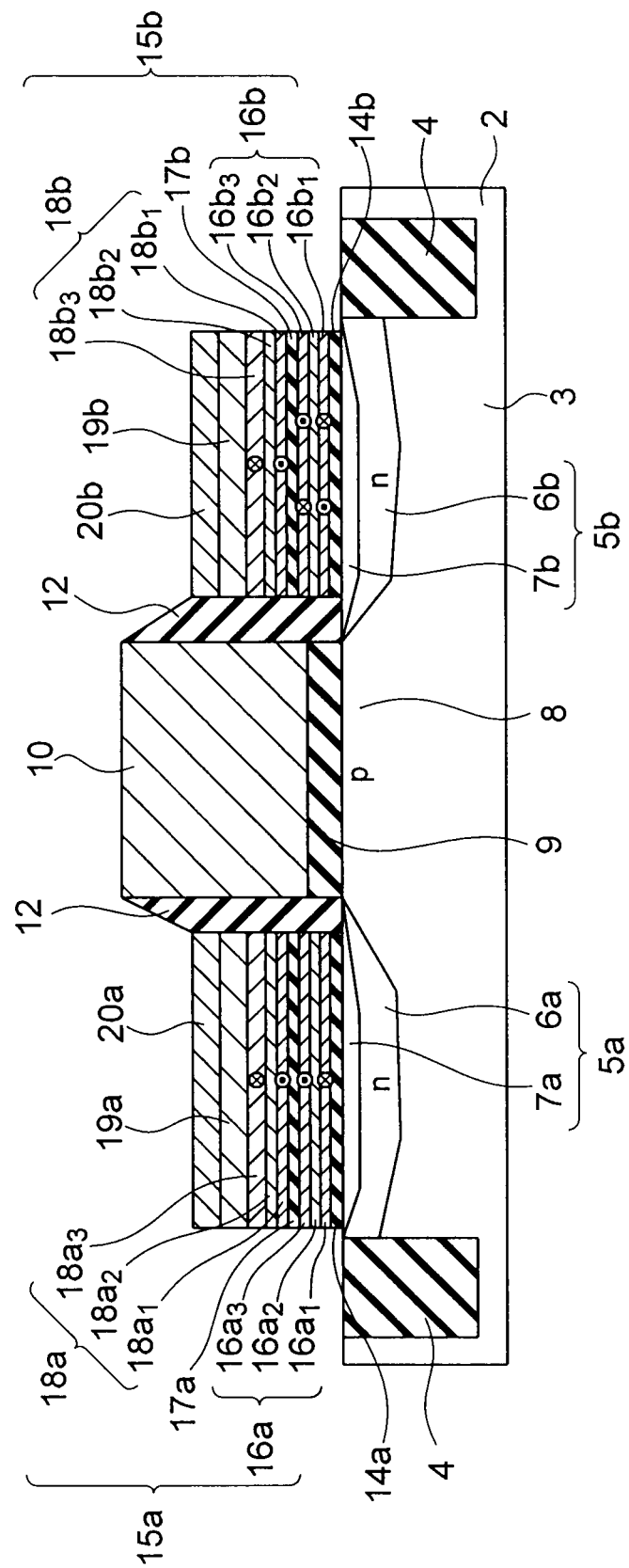
FIG. 9 is a cross-sectional view showing a spin MOSFET according to a fourth embodiment.

FIG. 9 is a cross-sectional view of a spin MOSFET in accordance with a fourth embodiment of the present invention. The spin MOSFET of this embodiment is the same as the spin MOSFET of the second modification of the first embodiment shown in FIG. 3, except that each ferromagnetic layer of the ferromagnetic stacked films of the source unit 15a and the drain unit 15b is replaced with a stacked structure formed with a ferromagnetic film, a nonmagnetic film, and a ferromagnetic film. This stacked structure is also called a synthetic antiferromagnetic stacked structure. In this stacked structure, there is an antiferromagnetic coupling between the two ferromagnetic films sandwiching the nonmagnetic film, or a bond formed with the opposite magnetization directions (antiparallel) of the two ferromagnetic films sandwiching the nonmagnetic film. In this embodiment, the ferromagnetic layer 16a of the source unit 15a has a stacked structure formed with a ferromagnetic film $16a_1$, a nonmagnetic film $16a_2$, and a ferromagnetic film $16a_3$. The ferromagnetic layer 18a of the source unit 15a has a stacked structure formed with a ferromagnetic film $18a_1$, a nonmagnetic film $18a_2$, and a ferromagnetic film $18a_3$. The magnetization direction of the ferromagnetic film $16a_3$ is the same as the magnetization direction of the ferromagnetic film $18a_1$. The ferromagnetic layer 16b of the drain unit 15b has a stacked structure formed with a ferromagnetic film $16b_1$, a nonmagnetic film $16b_2$, and a ferromagnetic film $16b_3$. The ferromagnetic layer 18b of the drain unit 15b has a stacked structure formed with a ferromagnetic film $18b_1$, a nonmagnetic film $18b_2$, and a ferromagnetic film $18b_3$.

In this embodiment illustrated in FIG. 9, the area of the film plane of the ferromagnetic stacked film of the source unit 15a is larger than the area of the film plane of the ferromagnetic stacked film of the drain unit 15b. Accordingly, the magnetization direction of the ferromagnetic layer 16b of the drain unit 15b located on the side of the semiconductor substrate 2, or the magnetization direction of the ferromagnetic film $16b_1$ and the ferromagnetic film $16b_3$, is variable with a write current. However, the magnetization direction of the ferromagnetic layer 16a of the source unit 15a located on the side of the semiconductor substrate 2, or the magnetization direction of the ferromagnetic film $16a_1$ and the ferromagnetic film $16a_3$, is invariable with a write current. Here, being "invariable" means that there is not a change in the magnetization direction before and after a write current flows in the spin MOSFET. Alternatively, the area of the film plane of the ferromagnetic stacked film of the source unit 15a may be smaller than the area of the film plane of the ferromagnetic stacked film of the drain unit 15b. It is preferable that the film-plane area ratio between the source unit 15a and the drain unit 15b is 1.1 or higher, and it is more preferable that the film-plane area ratio is 1.2 or higher.

In this embodiment, the magnetization direction of the ferromagnetic layer 18a of the source unit 15a, or the magnetization direction of the ferromagnetic films $18a_1$ and $18a_3$, is fixed by the antiferromagnetic layer 19a. The magnetization direction of the ferromagnetic layer 18b of the drain unit 15b, or the magnetization direction of the ferromagnetic films $18b_1$ and $18b_3$, is fixed by the antiferromagnetic layer 19b. By providing the antiferromagnetic layers 19a and 19b as in this embodiment, the magnetization of the ferromagnetic layers 18a and 18b of the synthetic ferromagnetic stacked structures can be more firmly fixed.

As each ferromagnetic layer of the ferromagnetic stacked films of the source unit 15a and the drain unit 15b has a synthetic antiferromagnetic stacked structure in this embodiment, the thermal stability of the magnetization of the ferromagnetic layers can be improved where the spin MOSFET is made smaller in size. Also, since the leakage magnetic field from each magnetic layer can be minimized, adverse influence between each two adjacent spin MOSFETs can be minimized where more than one spin MOSFETS are placed adjacent to one another. Thus, a false operation can be prevented.

As in the second modification of the first embodiment, spin injection writing can be performed at a higher speed in this embodiment. Also, the increase in production costs can be minimized.

It is of course possible to apply this embodiment to the second and third embodiments.

(Modification)

Figure 10:
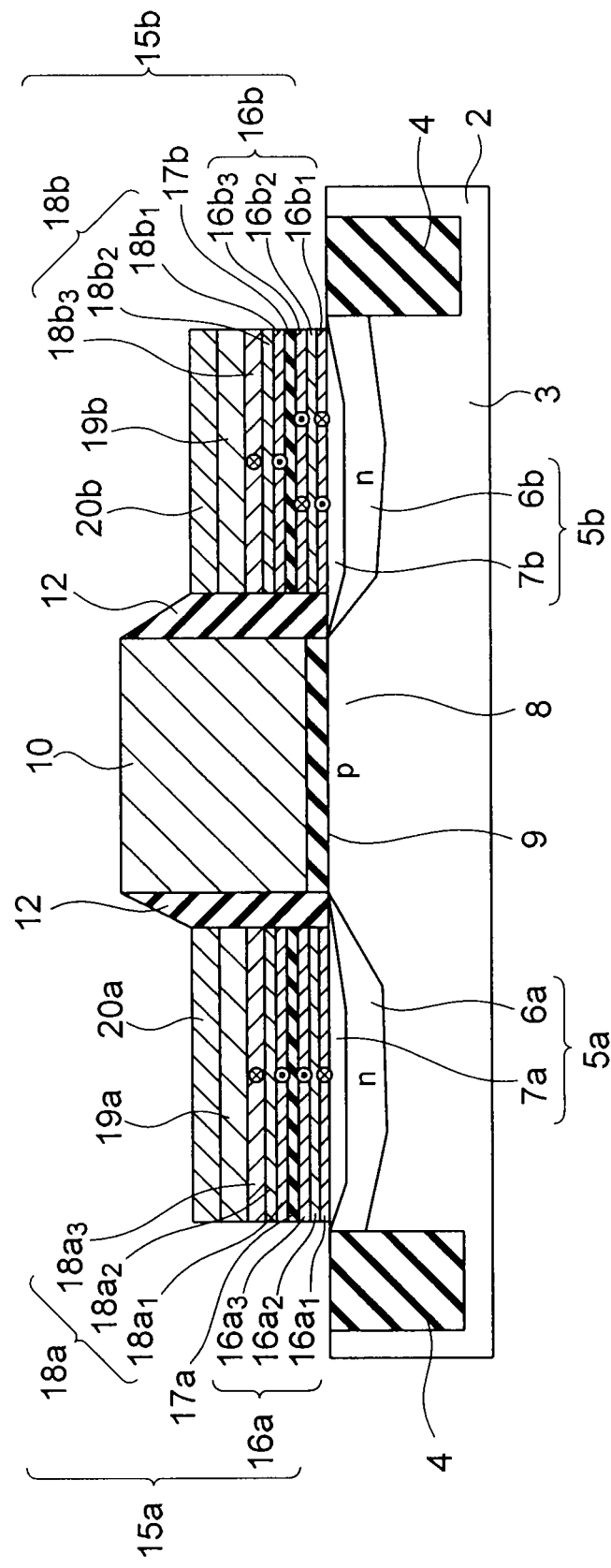
FIG. 10 is a cross-sectional view showing the spin MOSFET according to a modification of the fourth embodiment.

FIG. 10 is a cross-sectional view of a spin MOSFET in accordance with a modification of the fourth embodiment. The spin MOSFET of this modification is the same as the spin MOSFET of the fourth embodiment, except that the tunnel barrier 14a between the source unit 15a and the source region 5a is eliminated, and the tunnel barrier 14b between the drain unit 15b and the drain region 5b is eliminated. Therefore, the source unit 15a and the drain unit 15b are joined directly to the semiconductor substrate 2, and a Schottky barrier is formed at each of the interfaces. This structure is also the same as the spin MOSFET of the third modification of the first embodiment, except that each ferromagnetic layer of the ferromagnetic films of the source unit 15a and the drain unit 15b has a synthetic antiferromagnetic stacked structure.

In this modification, the thermal stability of the magnetization of the ferromagnetic layers can be improved where the spin MOSFET is made smaller in size as in the fourth embodiment. Also, since the leakage magnetic field from each ferromagnetic layer can be minimized, adverse influence between each two adjacent spin MOSFETs can be minimized where more than one spin MOSFETS are placed adjacent to one another. Thus, a false operation can be prevented. Also, spin injection writing can be performed at a higher speed, and the increase in production costs can be minimized.

It is of course possible to apply this modification to the second and third embodiments.

As each ferromagnetic layer of the ferromagnetic stacked films of the source unit 15a and the drain unit 15b has a synthetic antiferromagnetic stacked structure in the fourth embodiment and the modification, the thermal stability of the magnetization of the ferromagnetic layers is improved. However, it is also possible to improve the thermal stability of the magnetization of the ferromagnetic layers where each of the ferromagnetic layers is formed with a ferromagnetic layer having a magnetization direction perpendicular to the film plane. This structure is described below as a fifth embodiment.

(Fifth Embodiment)

Figure 11:
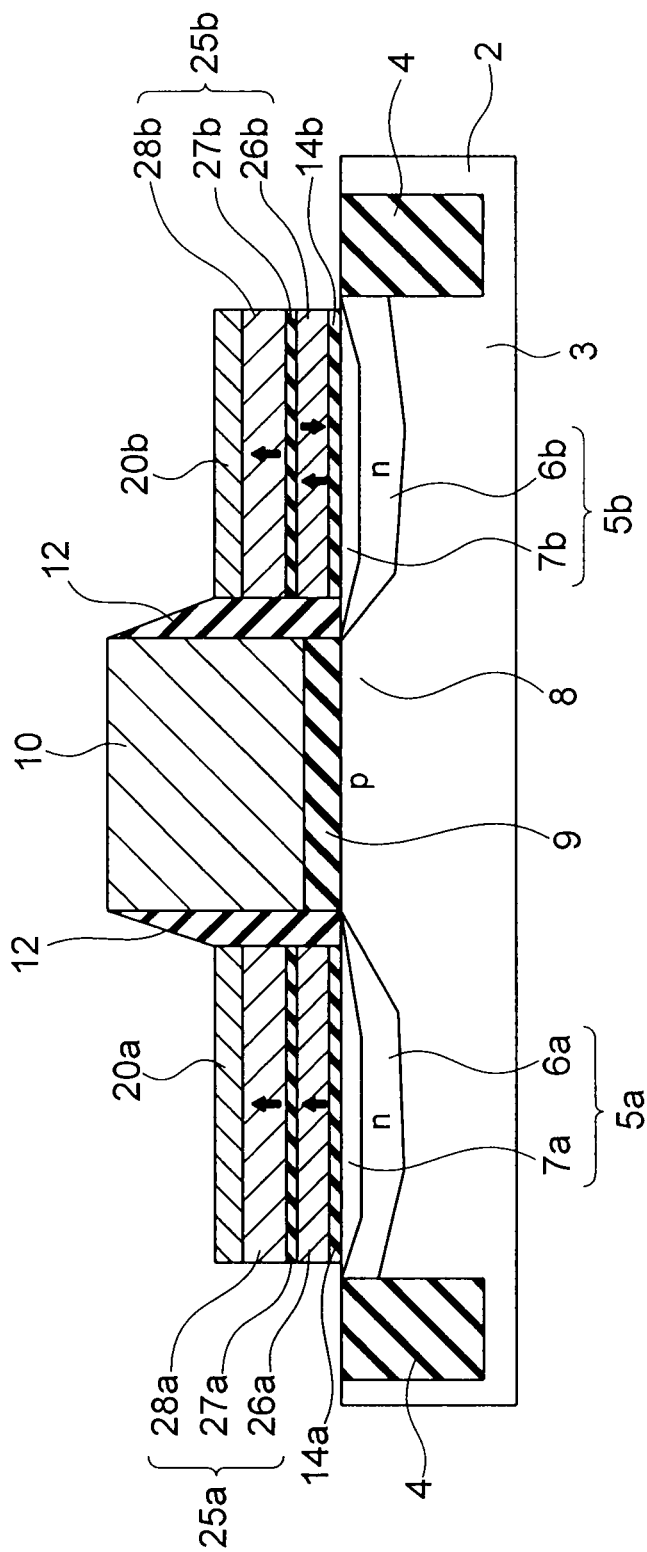
FIG. 11 is a cross-sectional view showing a spin MOSFET according to a fifth embodiment.

FIG. 11 is a cross-sectional view of a spin MOSFET in accordance with a fifth embodiment of the present invention. The spin MOSFET of this embodiment is the same as the spin MOSFET of the first embodiment shown in FIGS. 1A and 1B, except that each of the ferromagnetic layers of the ferromagnetic stacked films of the source unit and the drain unit is replaced with a ferromagnetic layer having a magnetization direction perpendicular to the film plane. More specifically, the source unit 25a is formed on the tunnel barrier 14a provided on the source region 5a. In the source unit 25a, a ferromagnetic layer 26a having a magnetization direction perpendicular to the film plane, a nonmagnetic layer (a tunnel barrier, for example) 27a, and a ferromagnetic layer 28a having a magnetization direction perpendicular to the film plane are stacked in this order. The drain unit 25b is formed on the tunnel barrier 14b provided on the drain region 5b. In the drain unit 25b, a ferromagnetic layer 26b having a magnetization direction perpendicular to the film plane, a nonmagnetic layer (a tunnel barrier, for example) 27b, and a ferromagnetic layer 28b having a magnetization direction perpendicular to the film plane are stacked in this order. In the source unit 25a, the magnetization direction of the ferromagnetic layer 26a is variable, but the magnetization direction of the ferromagnetic layer 28a is invariable. The magnetization direction of the ferromagnetic layer 26a is the same as (or parallel to) the magnetization direction of the ferromagnetic layer 28a. In the drain unit 25b, the magnetization direction of the ferromagnetic layer 26b is variable, but the magnetization direction of the ferromagnetic layer 28b is invariable. A ferromagnetic layer having a magnetization direction perpendicular to the film plane normally has a magnetization easy axis direction substantially perpendicular to the film plane. In this embodiment, each ferromagnetic layer having a magnetization direction perpendicular to the film plane has a magnetization easy axis direction substantially perpendicular to the substrate plane of the semiconductor substrate 2.

In this embodiment, the area of the film plane of the ferromagnetic stacked film of the source unit 25a is larger than the area of the film plane of the ferromagnetic stacked film of the drain unit 25b. Accordingly, the magnetization direction of the ferromagnetic layer 26a of the source unit 25a is not varied with a write current, but the magnetization direction of the ferromagnetic layer 26b of the drain unit 25b can be varied with a write current. Alternatively, the area of the film plane of the ferromagnetic stacked film of the source unit 25a may be made smaller than the area of the film plane of the ferromagnetic stacked film of the drain unit 25b. It is preferable that the film-plane area ratio between the source unit 25a and the drain unit 25b is 1.1 or higher, and it is more preferable that the film-plane area ratio is 1.2 or higher.

In a case where each ferromagnetic layer of the ferromagnetic stacked films of the source unit 25a and the drain unit 25b has a magnetization direction perpendicular to the film plane as in this embodiment, the spin-injection write current $I_c$ can be expressed by the following equation (3):

$$I_c = 2e\alpha MAt[H_k - H_d]/(\hbar g) \quad (3)$$

As a result of a comparison between the equation (3) and the equation (1), it becomes apparent that the write current can be reduced by the value represented by the term of the demagnetic field $H_d$ in the case where each ferromagnetic layer has a magnetization direction perpendicular to the film plane.

The spin MOSFET of this embodiment can improve the thermal stability of the magnetization of each ferromagnetic layer, and can perform spin injection writing at a higher speed. Furthermore, the spin MOSFET of this embodiment can minimize the increase in production costs.

It is of course possible to apply this embodiment to the second and third embodiments.

(Modification)

Figure 12:
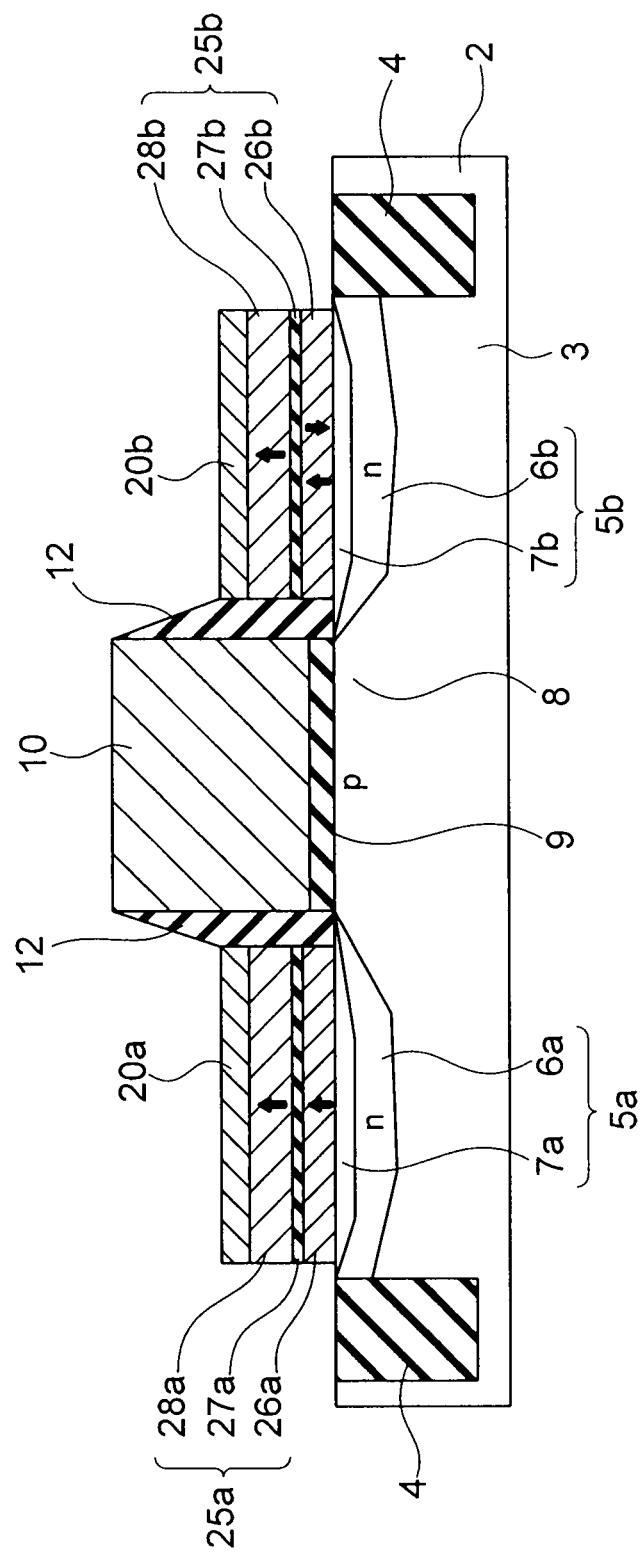
FIG. 12 is a cross-sectional view showing the spin MOSFET according to a modification of the fifth embodiment.

FIG. 12 is a cross-sectional view of a spin MOSFET in accordance with a modification of the fifth embodiment. The spin MOSFET of this modification is the same as the spin MOSFET of the fifth embodiment, except that the tunnel barrier 14a between the source unit 25a and the source region 5a is eliminated, and the tunnel barrier 14b between the drain unit 25b and the drain region 5b is also eliminated. Therefore, the source unit 25a and the drain unit 25b are joined directly to the semiconductor substrate 2, and a Schottky barrier is formed at each of the interfaces.

In this modification, the thermal stability of the magnetization of the ferromagnetic layers can be improved, and spin injection writing can be performed at a higher speed as in the fifth embodiment. Also, the increase in production costs can be minimized. Furthermore, the write current can be reduced by the value represented by the term of the demagnetic field $H_d$.

It is of course possible to apply this modification to the second and third embodiments.

(Sixth Embodiment)

Figure 13:
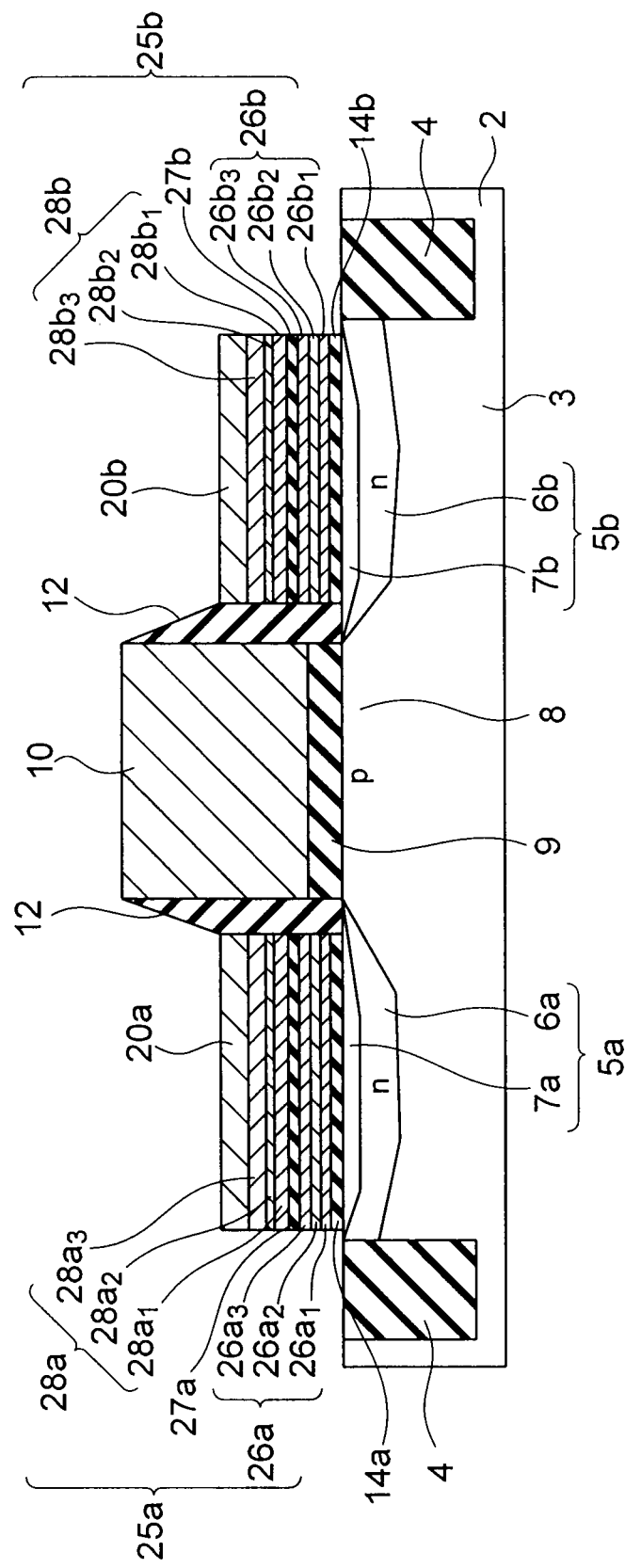
FIG. 13 is a cross-sectional view showing a spin MOSFET according to a fifth embodiment.

FIG. 13 is a cross-sectional view of a spin MOSFET in accordance with a sixth embodiment of the present invention. The spin MOSFET of this embodiment is the same as the spin MOSFET of the fifth embodiment, except that each magnetic layer of the source unit 25a and the drain unit 25b has a synthetic structure. More specifically, the ferromagnetic layer 26a of the source unit 25a has a stacked structure formed with a ferromagnetic film $26a_1$, a nonmagnetic film $26a_2$, and a ferromagnetic film $26a_3$. The ferromagnetic layer 28a of the source unit 25a has a stacked structure formed with a ferromagnetic film $28a_1$, a nonmagnetic film $28a_2$, and a ferromagnetic film $28a_3$. The magnetization direction of the ferromagnetic film $26a_3$ is the same as the magnetization direction of the ferromagnetic film $28a_1$. The ferromagnetic layer 26b of the drain unit 25b has a stacked structure formed with a ferromagnetic film $26b_1$, a nonmagnetic film $26b_2$, and a ferromagnetic film $26b_3$. The ferromagnetic layer 28b of the drain unit 25b has a stacked structure formed with a ferromagnetic film $28b_1$, a nonmagnetic film $28b_2$, and a ferromagnetic film $28b_3$.

In this embodiment illustrated in FIG. 13, the area of the film plane of the ferromagnetic stacked film of the source unit 25a is larger than the area of the film plane of the ferromagnetic stacked film of the drain unit 25b. Accordingly, the magnetization direction of the ferromagnetic layer 26b of the drain unit 25b located on the side of the semiconductor substrate 2, or the magnetization direction of the ferromagnetic film $26b_1$ and the ferromagnetic film $26b_3$, can be varied with a write current. However, the magnetization direction of the ferromagnetic layer 26a of the source unit 25a located on the side of the semiconductor substrate 2, or the magnetization direction of the ferromagnetic film $26a_1$ and the ferromagnetic film $26a_3$, is invariable with a write current. Here, being "invariable" means that there is not a change in the magnetization direction before and after a write current flows in the spin MOSFET. Alternatively, the area of the film plane of the ferromagnetic stacked film of the source unit 25a may be smaller than the area of the film plane of the ferromagnetic stacked film of the drain unit 25b. It is preferable that the film-plane area ratio between the source unit 25a and the drain unit 25b is 1.1 or higher, and it is more preferable that the film-plane area ratio is 1.2 or higher.

As each ferromagnetic layer of the ferromagnetic stacked films of the source unit 25a and the drain unit 25b has a synthetic structure in this embodiment, the thermal stability of the magnetization of the ferromagnetic layers can be improved where the spin MOSFET is made smaller in size. Also, since the leakage magnetic field from each magnetic layer can be minimized, adverse influence between each two adjacent spin MOSFETs can be minimized where more than one spin MOSFETS are placed adjacent to one another. Thus, a false operation can be prevented.

As in the fifth embodiment, spin injection writing can be performed at a higher speed in this embodiment. Also, the increase in production costs can be minimized. Furthermore, the write current can be reduced by the value represented by the term of the demagnetic field $H_d$.

It is of course possible to apply this embodiment to the second and third embodiments.

(Modification)

Figure 14:
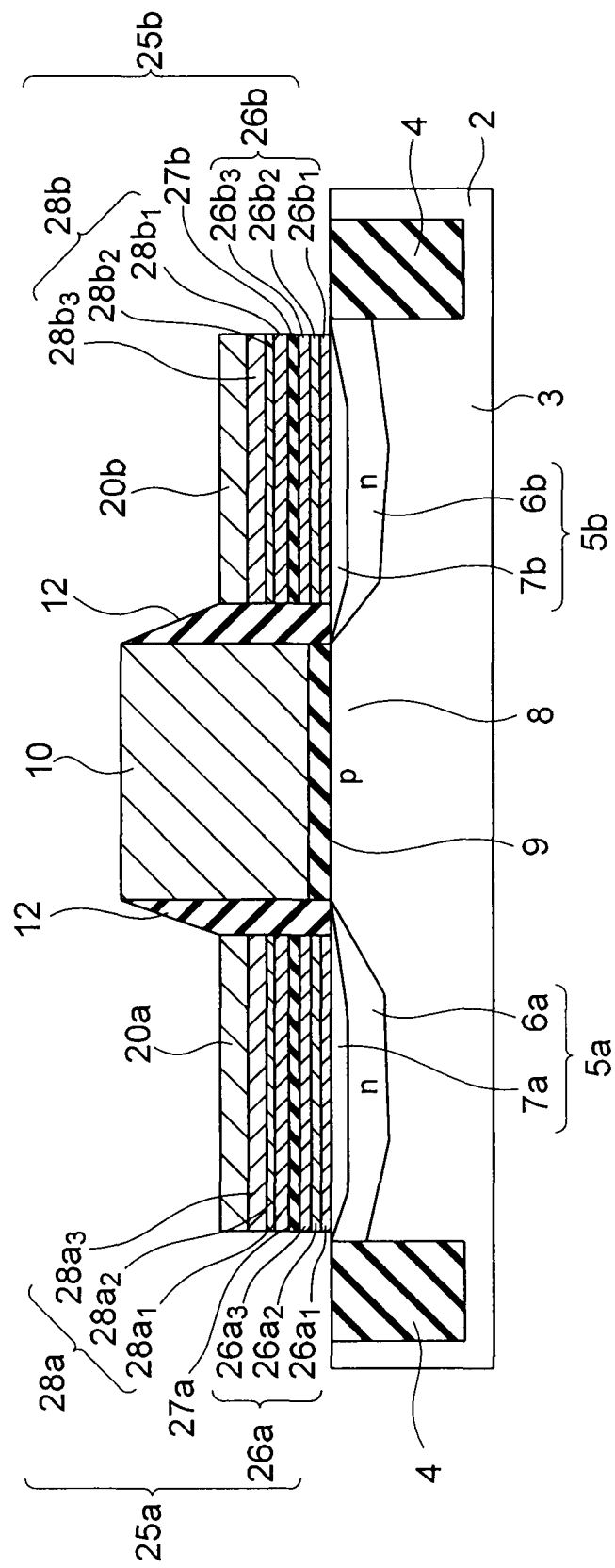
FIG. 14 is a cross-sectional view showing the spin MOSFET according to a modification of the fifth embodiment.

FIG. 14 is a cross-sectional view of a spin MOSFET in accordance with a modification of the sixth embodiment. The spin MOSFET of this modification is the same as the spin MOSFET of the sixth embodiment, except that the tunnel barrier 14a between the source unit 25a and the source region 5a is eliminated, and the tunnel barrier 14b between the drain unit 25b and the drain region 5b is eliminated. Therefore, the source unit 25a and the drain unit 25b are joined directly to the semiconductor substrate 2, and a Schottky barrier is formed at each of the interfaces.

In this modification, the thermal stability of the magnetization of the ferromagnetic layers can be improved, and spin injection writing can be performed at a higher speed as in the sixth embodiment. Also, the increase in the production costs can be minimized. Furthermore, the write current can be reduced by the value represented by the term of the demagnetic field $H_d$. Also, the thermal stability of the magnetization of the ferromagnetic layers can be improved where the spin MOSFET is made smaller in size as in the fourth embodiment. Also, since the leakage magnetic field from each ferromagnetic layer can be minimized, adverse influence between each two adjacent spin MOSFETs can be minimized where more than one spin MOSFETS are placed adjacent to one another. Thus, a false operation can be prevented.

It is of course possible to apply this modification to the second and third embodiments.

(Seventh Embodiment)

Next, a simple circuit structure that is actually used in a reconfigurable logic circuit is described.

In a case where a reconfigurable logic circuit is formed with spin MOSFETs, it is preferable that a common floating gate is used between two MOSFETs (MOSFET 1 and MOSFET 2).

Figure 15:
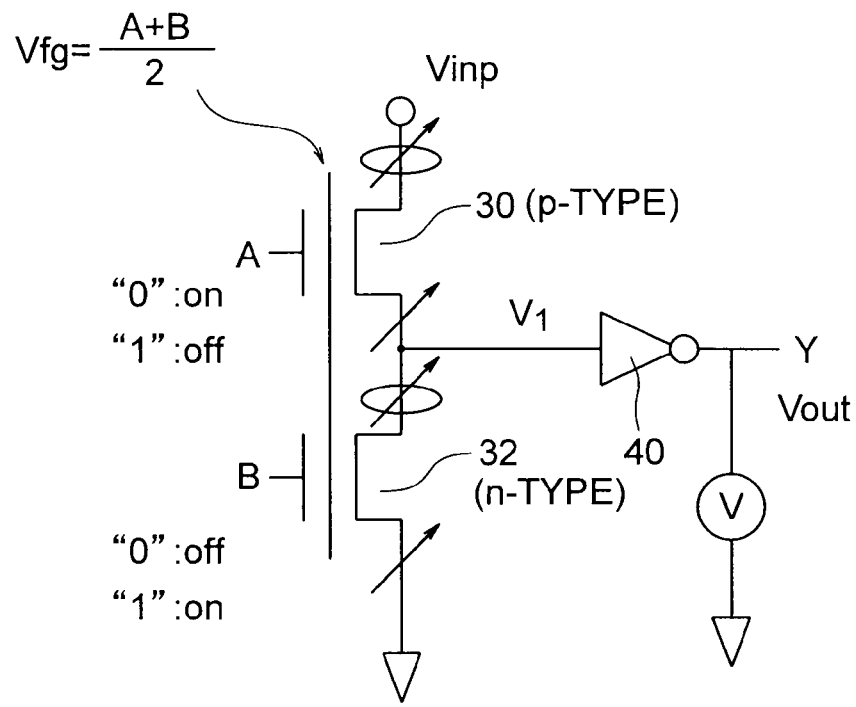
FIG. 15 is a circuit diagram showing a logic circuit according to a seventh embodiment.

FIG. 15 shows only an AND circuit and an OR circuit, since any other circuits such as an NOR circuit and an exclusive OR circuit can be produced if an AND circuit and an OR circuit can be produced. As shown in FIG. 15, the reconfigurable logic circuit is basically formed with two spin MOSFETs 30 and 32 that are the same as the spin MOSFET of one of the first through sixth embodiments and the modifications, except that a floating gate (not shown) and an interelectrode insulating film are provided between the gate insulating film 9 and the gate electrode 10. The spin MOSFET 30 is a p-type MOSFET that is formed in an n-type well region (not shown) of a p-type semiconductor substrate 2. The spin MOSFET 32 is an n-type MOSFET that is formed in a p-type semiconductor region of a p-type semiconductor substrate 2. The floating gate is shared between the MOSFETs 30 and 32. The source of the MOSFET 30 is connected to a power source Vinp, and the source of the MOSFET 32 is grounded. The drain of the MOSFET 30 is connected to the drain of the MOSFET 32. An output V1 from the common connection node is input to an inverter 40, and an output of the inverter 40 is set as an output Vout of the logic circuit of this embodiment.

Figure 16:
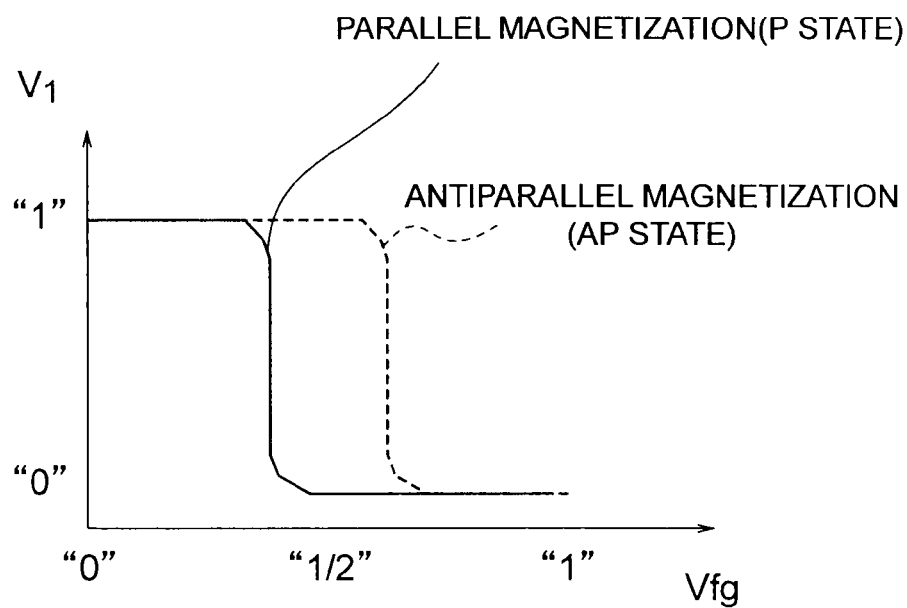
FIG. 16 is a diagram showing the floating gate voltage dependency of the output of the logic circuit according to the seventh embodiment.

In this manner, an AND circuit and an OR circuit can be formed. In a case where the floating gate voltage Vfg is ½ of the sum of the gate input A of the MOSFET 30 and the gate input B of the MOSFET 32, as shown in FIG. 16, the output voltage Y is changed between "1" and "0" when the spin moments of the closer ferromagnetic layers of the drain and source to the semiconductor substrate 2 switch between a "parallel" (P) state and an "antiparallel" (AP) state. In this embodiment, the spin moments in the MOSFET 30 are always in a parallel state.

FIG. 17 shows the values of the potential Vfg of the floating gate, the potential V1 of the common connection node between the MOSFETs 30 and 32, and the output Vout of the logic circuit, relative to the values of the inputs A and B of the gate electrodes of the MOSFETs 30 and 32 in a case where the spin moments of the closer ferromagnetic layers of the source and drain of the MOSFET 32 to the semiconductor substrate 2 are in an AP (antiparallel) state in the logic circuit of this embodiment. FIG. 18 shows the values of the potential Vfg of the floating gate, the potential V1 of the common connection node between the MOSFETs 30 and 32, and the output Vout of the logic circuit, relative to the values of the inputs A and B of the gate electrodes of the MOSFETs 30 and 32 in a case where the spin moments of the closer ferromagnetic layers of the source and drain of the MOSFET 32 to the semiconductor substrate 2 are in a P (parallel) state in the logic circuit of this embodiment. As shown in FIGS. 17 and 18, the logic circuit becomes an AND circuit when the spin moments of the closer ferromagnetic layers of the drain and source of the MOSFET 32 to the semiconductor substrate 2 are in an antiparallel state, and the logic circuit becomes an OR circuit when the spin moments of the closer ferromagnetic layers of the drain and source of the MOSFET 32 to the semiconductor substrate 2 are in a parallel state. Accordingly, by changing and reprogramming the spin moment of the ferromagnetic layer of the drain unit, a desired circuit can be formed without a modification to the logic circuit. In other words, a reconfigurable logic circuit can be obtained.

Figure 19:
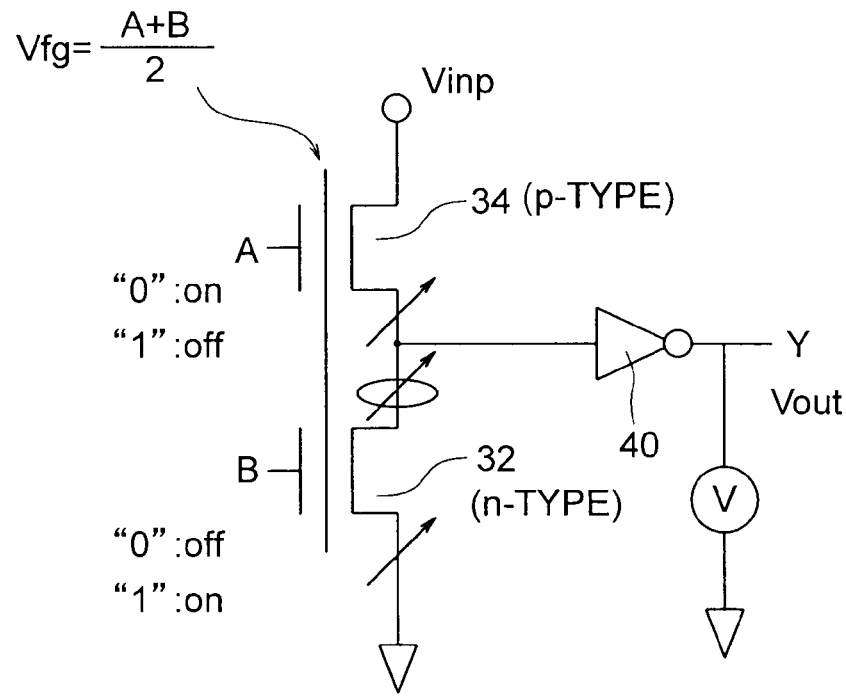
FIG. 19 is a circuit diagram showing a logic circuit according to a first modification of the seventh embodiment.

In a case where an AND circuit and an OR circuit are formed, all the transistors may be spin MOSFETs. However, some of the transistors may be regular MOSFETs. In a case where the spin MOSFET of one of the first through sixth embodiments and the modifications is used as one of the two transistors (the MOSFET 32, for example), and a regular p-MOSFET 34 not including a magnetic material is used as the other transistor, as shown in FIG. 19, the spin moments of the closer ferromagnetic layers of the source and drain of the spin MOSFET 32 to the semiconductor substrate 2 are controlled between a parallel state and an antiparallel state, so as to achieve the same results as above.

Figure 20:
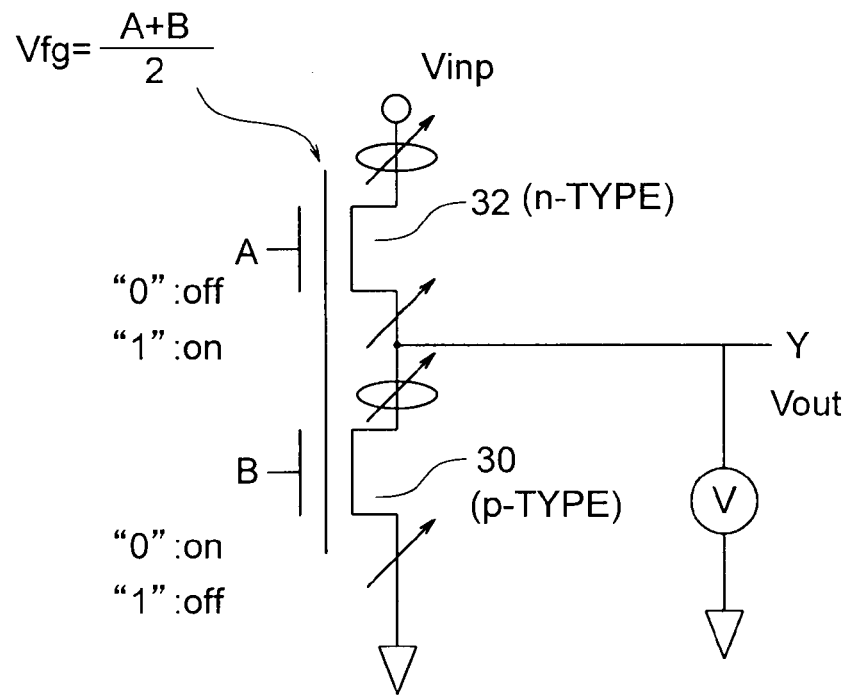
FIG. 20 is a circuit diagram showing a logic circuit according to a second modification of the seventh embodiment.

Also, as shown in FIG. 20, the same effects as above can be achieved where the connections of the n-type MOSFET 32 and the p-type MOSFET 30 are switched without the use of the inverter 40 so that the spin moments of the closer ferromagnetic layers of the source and drain of the p-type MOS- FET 30 to the semiconductor substrate 2 are controlled between a parallel state and an antiparallel state.

In a case where the above logic circuit is used, the logic circuit further includes a gate voltage control circuit for reading information from the spin MOSFETs, a sense current control device circuit that controls the sense current, a write current control circuit, a driver, and a sinker.

The reconfigurable logic circuit described in this embodiment is merely a specific example, and reconfigurable logic circuits that can be formed with spin MOSFETs of one of the first through sixth embodiments and the modifications are not limited to the reconfigurable logic circuit of this embodiment.

To realize a logic circuit including a large number of spin MOSFETs, it is necessary to use synthetic antiferromagnetic stacked films or magnetic layers each having magnetization direction perpendicular to the film plane.

It is preferable that each ferromagnetic film (a magnetic material) used in each synthetic antiferromagnetic stacked film is formed with one thin film selected from the group consisting of Ni—Fe, Co—Fe, Co—Fe—Ni alloys, amorphous materials such as (Co, Fe, Ni)—(B), (Co, Fe, Ni)—(B)—(P,Al, Mo, Nb, Mn)-based, and Co—(Zr, Hf, Nb, Ta, Ti) films, and Co-base full-Heusler materials. Alternatively, each ferromagnetic film is formed with a multilayer film formed with some of those films. Here, a Co-base full-Heusler material is denoted by $Co_2AB$, where A contains at least one element selected from the group consisting of Cr, Mn, Fe, V, and Ti, and B contains at least one element selected from the group consisting of Al, Si, Ge, Ga, Sb, and Fe. If B contains Fe, A does not contain Fe.

Each ferromagnetic layer having a magnetization direction perpendicular to the film plane is formed with Fe—Pd, Fe—Pt, Fe—Pd—Pt, a Co/Ni stacked film, a Fe/Pd stacked film, or a Fe/Pt stacked film. On such a film, an Ni—Fe, Co—Fe, or Co—Fe—Ni alloy, an amorphous material such as (Co, Fe, Ni)—(B), (Co, Fe, Ni)—(B)—(P, Al, Mo, Nb, Mn)-based, or a Co—(Zr, Hf, Nb, Ta, Ti) film, or a Co-base full-Heusler material that increases the magnetoresistive effect is stacked on the side of the nonmagnetic layer (including a tunnel barrier). Here, each symbol "-" represents an alloy, each symbol "/" represents a stacked structure, and "," means that at least one of the elements shown in the brackets is contained.

It is preferable that the material of each nonmagnetic layer is a metal element such as Cu, Ag, or Au, or an alloy containing those materials, or an oxide such as $AlO_x$, MgO, or $SiO_x$.

It is preferable that the material of the nonmagnetic layer used in each synthetic antiferromagnetic stacked film is Ru, Rh, Ir, or an alloy containing those materials.

It is preferable to use PtMn, Ir—Mn, FeMn, Pt—Cr—Mn, or Ni—Mn for the antiferromagnetic layers.

EXAMPLES

In the following, the embodiments of the present invention are described in greater detail, with reference to specific examples.

Example 1

As spin MOSFETs in accordance with Example 1 of the present invention, four types of spin MOSFETs, Samples 1 through 4, are prepared.

Sample 1 is the spin MOSFET of the fourth embodiment shown in FIG. 9. Each ferromagnetic layer of the ferromagnetic stacked films of the source unit 15a and the drain unit 15b has a synthetic structure.

Sample 2 is the spin MOSFET of the modification of the fourth embodiment shown in FIG. 10. Each ferromagnetic layer of the ferromagnetic stacked films of the source unit 15a and the drain unit 15b has a synthetic structure, and a Schottky barrier is formed at each interface between those ferromagnetic stacked films and the semiconductor substrate.

Sample 3 is the spin MOSFET of the fifth embodiment shown in FIG. 11. Each ferromagnetic layer of the ferromagnetic stacked films of the source unit 25a and the drain unit 25b has a magnetization direction perpendicular to the film plane.

Sample 4 is the spin MOSFET of the modification of the fifth embodiment shown in FIG. 12. Each ferromagnetic layer of the ferromagnetic stacked films of the source unit 25a and the drain unit 25b has a magnetization direction perpendicular to the film plane, and a Schottky barrier is formed at each interface between those ferromagnetic stacked films and the semiconductor substrate.

Figure 21:
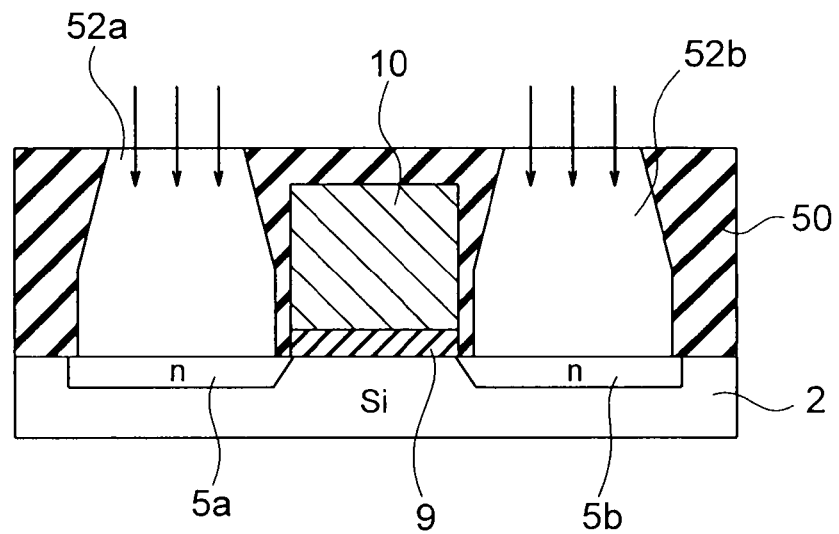
FIG. 21 is a cross-sectional view illustrating a method for manufacturing a spin MOSFET having different MJT film-plane areas from each other.

In each of Samples 1 through 4, the shapes of the planes of the ferromagnetic stacked films of the source unit and the drain unit have the same aspect ratio (the ratio between the length in the vertical direction and the length in the transverse direction) but have different areas from each other. A spin MOSFET in which the film planes of the ferromagnetic stacked films of the source unit and the drain unit have different areas from each other is formed in the following manner. First, as shown in FIG. 21, the source region 5a and the drain region 5b are formed at a distance from each other on the semiconductor substrate 2. The gate insulating film 9 is formed on the portion of the semiconductor substrate 2 located between the source region 5a and the drain region 5b. The gate 10 is formed on the gate insulating film 9. The source region 5a and the drain region 5b may be formed after the gate insulating film 9 and the gate 10 are formed. An interlayer insulating film 50 made of $SiO_2$ is then deposited so as to cover the gate 10. Holes 52a and 52b having different areas from each other are then formed in the interlayer insulating film 50. By performing a high-voltage RF sputtering, a ferromagnetic stacked film is deposited so as to fill the holes 52a and 52b. The portions of the ferromagnetic stacked film existing on the upper face of the interlayer insulating film 50 are then removed by CMP (Chemical Mechanical Polishing). In this manner, a spin MOSFET in which the film planes of the ferromagnetic stacked films of the source unit and the drain unit have different areas from each other is formed.

Figure 22:
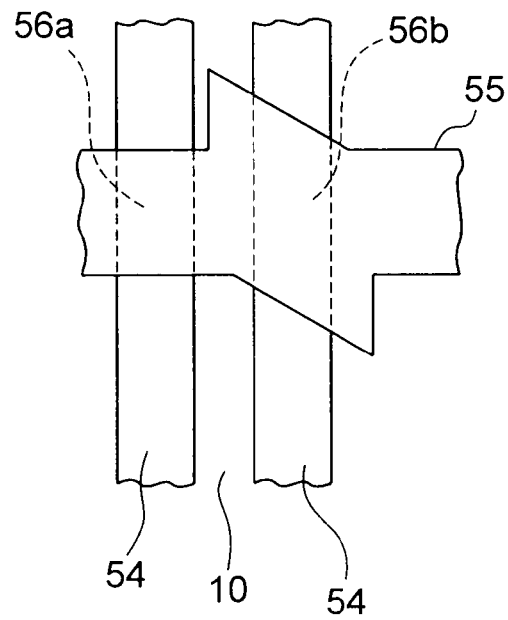
FIG. 22 is a top view illustrating another method for manufacturing a spin MOSFET having different MJT film-plane areas from each other.

Alternatively, such a spin MOSFET may be performed in the manner illustrated in FIG. 22. FIG. 22 is a top view of the spin MOSFET where etching is performed on the ferromagnetic stacked film. The gate insulating film (not shown) and the gate 10 are formed on the semiconductor substrate, and the source and drain regions (not shown) are formed. After that, a ferromagnetic stacked film is deposited on each of the source and drain regions located on both sides of the gate 10. When patterning is performed on the ferromagnetic stacked films, double exposure is performed as shown in FIG. 22. For example, with the use of a mask 54, the regions corresponding to the source unit and the drain unit are exposed by a first-time exposure process. With the use of a mask 55, the regions corresponding to the source unit and the drain unit are exposed by a second-time exposure process. Developing and etching are then performed, so that the ferromagnetic stacked film 56a of the source unit and the ferromagnetic stacked film 56b of the drain unit have different film-plane areas from each other.

In this example, spin MOSFETs are formed by the method illustrated in FIG. 21. The formation of the device isolation grooves, the formation of the gate, the ion implantation, and the RTA process for activating the implanted impurities are the same as those in a regular MOS process. After the interlayer insulating film 50 is formed, etchback is performed so as to flatten the interlayer insulating film 50, as shown in FIG. 21. Holes 52a and 52b for forming the ferromagnetic stacked films of the source unit and the drain unit are then formed. The holes 52a and 52b have the same planar shapes, but have different areas from each other. A ferromagnetic stacked film is then deposited so as to fill the holes 52a and 52b. After CMP is performed, an $SiO_2$ film (not shown) is formed, and a via continuing to the ferromagnetic stacked film is formed in the $SiO_2$ film. The via is filled with a wiring material, so as to form a wire. Before the wire is formed, the areas of the source unit and the drain unit are measured by shape SEM. As for the sizes of the holes 52a and 52b of the source unit and the drain unit, the calculated size of the drain unit is 0.1 μm×0.15 μm, and the set size of the holes of the source unit is 1.1, 1.2, 1.3, 1.4, or 1.5 times larger than the area of the drain unit. The actual sizes are measured by shape SEM. The shape of each actual hole is an elliptic shape, and the actual area ratio is calculated from the areas of the ellipses.

The stacked structures of the ferromagnetic stacked films of Samples 1 through 4 are as follows:
(Sample 1)
Si substrate/$SiO_2$ (0.5 nm)/MgO (0.5 nm)/CoFeB (3 nm)/Ru (0.9 nm)/CoFeB (3.5 nm)/Mg (0.6 nm)/MgO (0.5 nm)/CoFeB (4 nm)/Ru (0.9 nm)/CoFe (2.5 nm)/IrMn (10 nm)/Ru (5 nm)/Ta (50 nm)
(Sample 2)
Si substrate/CoFeB (3 nm)/Ru (0.9 nm)/CoFeB (3.5 nm)/Mg (0.6 nm)/MgO (0.5 nm)/CoFeB (4 nm)/Ru (0.9 nm)/CoFe (2.5 nm)/IrMn (10 nm)/Ru (5 nm)/Ta (50 nm)
(Sample 3)
Si substrate/$SiO_2$ (0.5 nm)/MgO (0.5 nm)/FePd (4 nm)/CoFeB (2 nm)/Mg (0.6 nm)/MgO (0.5 nm)/CoFeB (3 nm)/FePd (10 nm)/Ru (5 nm)/Ta (50 nm)
(Sample 4)
Si substrate/FePd (4 nm)/CoFeB (2 nm)/Mg (0.6 nm)/MgO (0.5 nm)/CoFeB (3 nm)/FePd (10 nm)/Ru (5 nm)/Ta (50 nm)

The numeric values shown in the brackets are film thicknesses. In Sample 1 and Sample 3, an $SiO_2$ film (0.5 nm) is interposed between an Si substrate and an MgO film (0.5 nm) serving as a tunnel barrier. This $SiO_2$ film is an interfacial oxide film that is formed when the MgO film (0.5 nm) is formed. Although an Mg (0.6 nm) film is interposed between an MgO film (0.5 nm) and a magnetic film (such as a CoFeB film), the Mg film may not be included. This also applies to the later described examples.

After those samples are manufactured, an anneal is performed in a magnetic field at 350° C. for one hour, so that the spin directions of the ferromagnetic stacked films in the initial state are in a low-resistance state (the spin directions of the magnetic layers sandwiching each tunnel barrier are in a parallel state).

Figure 23:
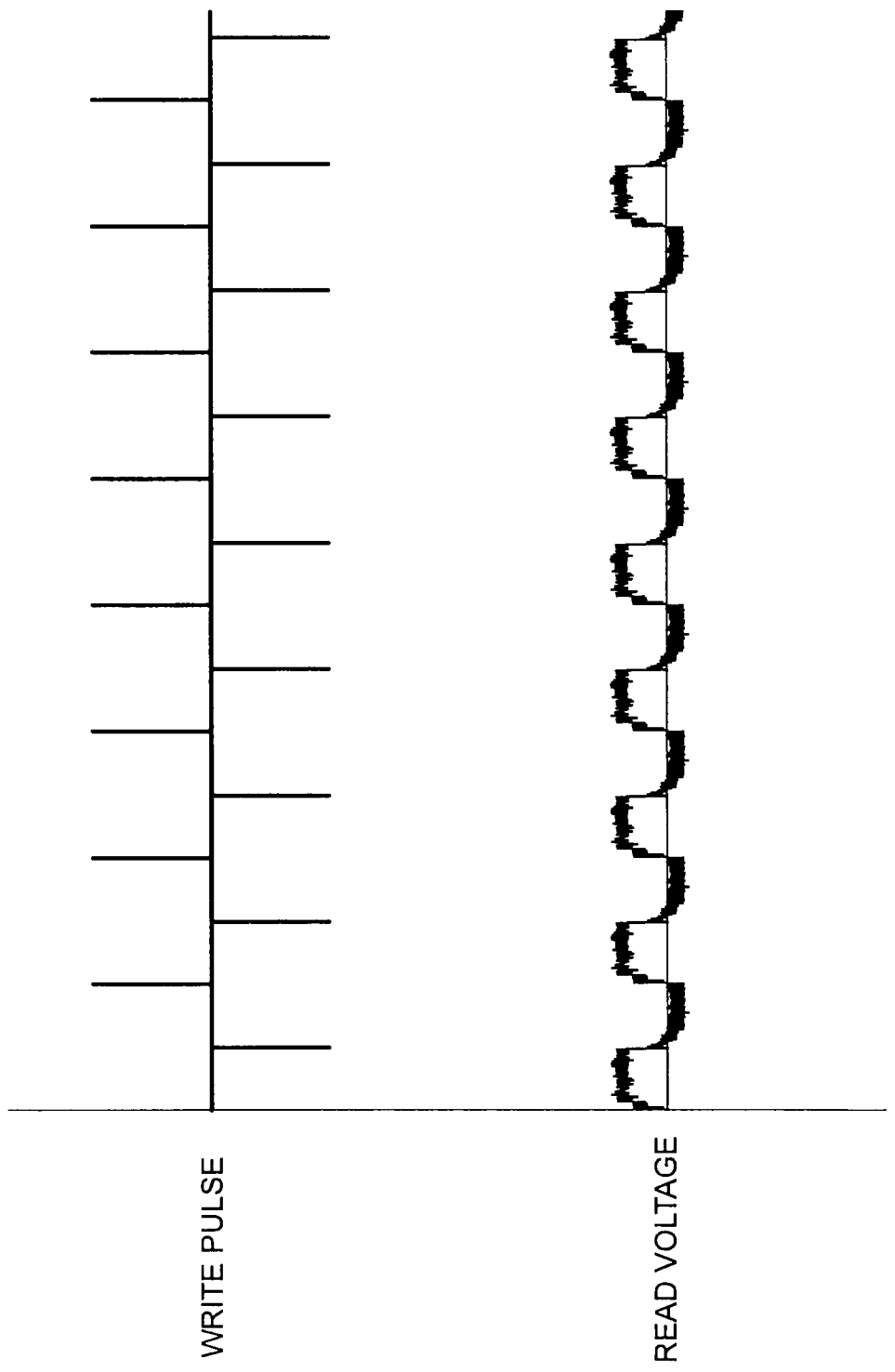
FIG. 23 is a waveform chart showing write pulses that were used in spin injection writing experiments and resistance value reading experiments.

After that, a pulse current is applied between the source and drain, with the gate being in an ON state. In this manner, spin injection writing and resistance-value reading are performed. As the spin-injection write pulse, a positive pulse and a negative pulse are alternately applied as shown in FIG. 23. This is repeated 1000 times, so as to check whether the spin direction of the free layer of the ferromagnetic stacked film (the MTJ stacked film) having the larger area does not vary, and whether there is not a false operation with the current that reverses only the spin direction of the free layer of the ferromagnetic stacked film (the MTJ stacked film) having the smaller area. If a false operation is caused, and the spin directions of the free layers of both ferromagnetic stacked films are reversed, the read voltages have almost the same values. FIGS. 24 through 27 show the results of checks made to determine whether a false operation is caused. FIGS. 24 through 27 concern Samples 1 through 4, respectively. As is apparent from FIGS. 24 through 27, a false operation is not caused if the area ratio is 1.1 or higher.

In this example, the semiconductor substrate is an Si substrate. However, the same effects as above can be achieved in cases where the semiconductor substrate is a Ge substrate, an Si—Ge substrate, or a GaAs substrate.

Example 2

As spin MOSFETs in accordance with Example 2 of the present invention, four types of spin MOSFETs, Samples 5 through 8, are prepared.

Sample 5 is the spin MOSFET of the fourth embodiment shown in FIG. 9. Each ferromagnetic layer of the ferromagnetic stacked films of the source unit 15a and the drain unit 15b has a synthetic structure.

Sample 6 is the spin MOSFET of the modification of the fourth embodiment shown in FIG. 10. Each ferromagnetic layer of the ferromagnetic stacked films of the source unit 15a and the drain unit 15b has a synthetic structure, and a Schottky barrier is formed at each interface between those ferromagnetic stacked films and the semiconductor substrate.

Sample 7 is the spin MOSFET of the fifth embodiment shown in FIG. 11. Each ferromagnetic layer of the ferromagnetic stacked films of the source unit 25a and the drain unit 25b has a magnetization direction perpendicular to the film plane.

Sample 8 is the spin MOSFET of the modification of the fifth embodiment shown in FIG. 12. Each ferromagnetic layer of the ferromagnetic stacked films of the source unit 25a and the drain unit 25b has a magnetization direction perpendicular to the film plane, and a Schottky barrier is formed at each interface between those ferromagnetic stacked films and the semiconductor substrate.

In each of Samples 5 through 8, the lengths of the shapes of the planes of the ferromagnetic stacked films of the source unit and the drain unit are varied so as to change the aspect ratio and change the areas.

The method for manufacturing those samples is the same as the method explained in Example 1. Before wires are formed, the areas of the source unit and the drain unit are measured by shape SEM.

The stacked structures of the ferromagnetic stacked films of Samples 5 through 8 are as follows:
(Sample 5)
Semiconductor Si/$SiO_2$ (0.5 nm)/MgO (0.5 nm)/CoFeB (3 nm)/Ru (0.9 nm)/$Co_2FeAl_{0.5}Si_{0.5}$ (3.5 nm)/Mg (0.6 nm)/MgO (0.5 nm)/$Co_2FeAl_{0.5}Si_{0.5}$ (3.5 nm)/Ru (0.9 nm)/CoFe (2.5 nm)/IrMn (10 nm)/Ru (5 nm)/Ta (50 nm)
(Sample 6)
Semiconductor Si/CoFeB (3 nm)/Ru (0.9 nm)/$Co_2FeAl_{0.5}Si_{0.5}$ (3.5 nm)/Mg (0.6 nm)/MgO (0.5 nm)/$Co_2FeAl_{0.5}Si_{0.5}$ (3.5 nm)/Ru (0.9 nm)/CoFe (2.5 nm)/IrMn (10 nm)/Ru (5 nm)/Ta (50 nm)
(Sample 7)
Semiconductor Si/$SiO_2$ (0.5 nm)/MgO (0.5 nm)/FePd (4 nm)/$Co_2FeAl_{0.5}Si_{0.5}$ (2 nm)/Mg (0.6 nm)/MgO (0.5 nm)/$Co_2FeAl_{0.5}Si_{0.5}$ (3 nm)/FePd (10 nm)/Ru (5 nm)/Ta (50 nm)
(Sample 8)
Semiconductor Si/FePd (4 nm)/$Co_2FeAl_{0.5}Si_{0.5}$ (2 nm)/Mg (0.6 nm)/MgO (0.5 nm)/$Co_2FeAl_{0.5}Si_{0.5}$ (3 nm)/FePd (10 nm)/Ru (5 nm)/Ta (50 nm)

After those samples are manufactured, an anneal is performed in a magnetic field at 350° C. for one hour, so that the spin directions of the ferromagnetic stacked films in the initial state are in a low-resistance state (the spin directions of the magnetic layers sandwiching each tunnel barrier are in a parallel state).

After that, a pulse current is applied between the source and drain, with the gate being in an ON state. In this manner, spin injection writing and resistance-value reading are performed. As the spin-injection write pulse, a positive pulse and a negative pulse are alternately applied as in Example 1. This is repeated 1000 times, so as to check whether the spin direction of the free layer of the ferromagnetic stacked film (the MTJ stacked film) having the larger area does not vary, and whether there is not a false operation with the current that reverses only the spin direction of the free layer of the ferromagnetic stacked film (the MTJ stacked film) having the smaller area. If a false operation is caused, and the spin directions of the free layers of both ferromagnetic stacked films are reversed, the read voltages have almost the same values. FIGS. 28 through 31 show the results of checks made to determine whether a false operation is caused. FIGS. 28 through 31 concern Samples 5 through 8, respectively. As is apparent from the results shown in FIGS. 28 through 31, a false operation is not caused if the area ratio is 1.1 or higher. In this example, the semiconductor substrate is an Si substrate. However, the same effects as above can be achieved in cases where the semiconductor substrate is a Ge substrate, an Si—Ge substrate, or a GaAs substrate.

Example 3

As spin MOSFETs in accordance with Example 3 of the present invention, four types of spin MOSFETs, Samples 9 through 12, are prepared.

Sample 9 is the spin MOSFET of the fourth embodiment shown in FIG. 9. Each ferromagnetic layer of the ferromagnetic stacked films of the source unit 15a and the drain unit 15b has a synthetic structure.

Sample 10 is the spin MOSFET of the modification of the fourth embodiment shown in FIG. 10. Each ferromagnetic layer of the ferromagnetic stacked films of the source unit 15a and the drain unit 15b has a synthetic structure, and a Schottky barrier is formed at each interface between those ferromagnetic stacked films and the semiconductor substrate.

Sample 11 is the spin MOSFET of the fifth embodiment shown in FIG. 11. Each ferromagnetic layer of the ferromagnetic stacked films of the source unit 25a and the drain unit 25b has a magnetization direction perpendicular to the film plane.

Sample 12 is the spin MOSFET of the modification of the fifth embodiment shown in FIG. 12. Each ferromagnetic layer of the ferromagnetic stacked films of the source unit 25a and the drain unit 25b has a magnetization direction perpendicular to the film plane, and a Schottky barrier is formed at each interface between those ferromagnetic stacked films and the semiconductor substrate.

In each of Samples 9 through 12, the lengths of the shapes of the planes of the ferromagnetic stacked films of the source unit and the drain unit are varied so as to change the aspect ratio and change the areas. The method for manufacturing those samples is the same as the method explained in Example 1. Before wires are formed, the areas of the source unit and the drain unit are measured by shape SEM.

The stacked structures of the ferromagnetic stacked films of Samples 9 through 12 are as follows:
(Sample 9)
Semiconductor Si/SiO$_2$ (0.5 nm)/MgO (0.5 nm)/CoFeB (3 nm)/Ru (0.9 nm)/CoFeB (3.5 nm)/Mg (0.6 nm)/MgO (0.5 nm)/CoFeB (4 nm)/Ru (0.9 nm)/CoFe (2.5 nm)/IrMn (10 nm)/Ru (5 nm)/Ta (50 nm)
(Sample 10)
Semiconductor Si/CoFeB (3 nm)/Ru (0.9 nm)/CoFeB (3.5 nm)/Mg (0.6 nm)/MgO (0.5 nm)/CoFeB (4 nm)/Ru (0.9 nm)/CoFe (2.5 nm)/IrMn (10 nm)/Ru (5 nm)/Ta (50 nm)
(Sample 11)
Semiconductor Si/SiO$_2$ (0.5 nm)/MgO (0.5 nm)/FePd (4 nm)/CoFeB (2 nm)/Mg (0.6 nm)/MgO (0.5 nm)/CoFeB (3 nm)/FePd (10 nm)/Ru (5 nm)/Ta (50 nm)
(Sample 12)
Semiconductor Si/FePd (4 nm)/CoFeB (2 nm)/Mg (0.6 nm)/MgO (0.5 nm)/CoFeB (3 nm)/FePd (10 nm)/Ru (5 nm)/Ta (50 nm)

After those samples are manufactured, an anneal is performed in a magnetic field at 350° C. for one hour, so that the spin directions of the ferromagnetic stacked films in the initial state are in a low-resistance state (the spin directions of the magnetic layers sandwiching a tunnel barrier are in a parallel state).

After that, a pulse current is applied between the source and drain, with the gate being in an ON state. In this manner, spin injection writing and resistance-value reading are performed. As the spin-injection write pulse, a positive pulse and a negative pulse are alternately applied as in Example 1. This is repeated 1000 times, so as to check whether the spin direction of the free layer of the ferromagnetic stacked film (the MTJ stacked film) having the larger area does not vary, and whether there is not a false operation with the current that reverses only the spin direction of the free layer of the ferromagnetic stacked film (the MTJ stacked film) having the smaller area. If a false operation is caused, and the spin directions of the free layers of both ferromagnetic stacked films are reversed, the read voltages have almost the same values. FIGS. 32 through 35 show the results of checks made to determine whether a false operation is caused. FIGS. 32 through 35 concern Samples 9 through 12, respectively. As is apparent from the results shown in FIGS. 32 through 35, a false operation is not caused if the area ratio is 1.1 or higher. In this example, the semiconductor substrate is an Si substrate. However, the same effects as above can be achieved in cases where the semiconductor substrate is a Ge substrate, an Si—Ge substrate, or a GaAs substrate.

As described so far, each embodiment of the present invention can provide a spin MOSFET that can minimize the increase in production costs, and can perform spin injection writing and reading.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:
1. A spin MOSFET comprising:
a substrate that has a semiconductor region of a first conductivity type;
first and second ferromagnetic stacked films that are formed at a distance from each other on the semiconductor region, and each have the same stacked structure comprising a first ferromagnetic layer, a nonmagnetic layer, and a second ferromagnetic layer stacked in this order, the second ferromagnetic stacked film having a same or different aspect ratio and a film-plane area at least 1.1 times larger than that of the first ferromagnetic stacked film, the first ferromagnetic layers of the first and second ferromagnetic stacked films having substantially same layer thickness and being made of substantially same material, the nonmagnetic layers of the first and second ferromagnetic stacked films having substantially same layer thickness and being made of substantially same material, the second ferromagnetic layers of the first and second ferromagnetic stacked films having substantially same layer thickness and different from the first ferromagnetic layers of the first and second ferromagnetic stacked films and being made of substantially the same material, the first ferromagnetic layers of the first and second ferromagnetic stacked films being closest to the substrate among the first and second ferromagnetic stacked films;

a gate insulating film that is formed on a portion of the semiconductor region, the portion being located between the first ferromagnetic stacked film and the second ferromagnetic stacked film; and a gate that is formed on the gate insulating film, wherein the portion of the semiconductor region is a current path of each of writing current and reading current, the first ferromagnetic layer in the first ferromagnetic stacked film has a magnetization that is changeable and the second ferromagnetic layer in the first ferromagnetic stacked film has a magnetization that is unchangeable when the writing current is flowed between the first and second ferromagnetic stacked films via the portion of the semiconductor region, and each of the first and second ferromagnetic layers in the second ferromagnetic stacked film has a magnetization that is unchangeable when the writing current is flowed between the first and second ferromagnetic stacked films via the portion of the semiconductor region.

2. The spin MOSFET according to claim 1, wherein film planes of the first and second ferromagnetic stacked films have different shapes from each other.

3. The spin MOSFET according to claim 1, wherein at least one of film planes of the first and second ferromagnetic stacked films has a line-asymmetric shape.

4. The spin MOSFET according to claim 1, wherein a tunnel barrier is formed between the semiconductor region and each of the first ferromagnetic layers of the first and second ferromagnetic stacked films.

5. The spin MOSFET according to claim 1, wherein:

a first impurity region of a second conductivity type that is different from the first conductivity type is provided at each portion of the semiconductor region located below the first and second ferromagnetic stacked films; and a second impurity region of the second conductivity type having higher concentration than the first impurity region is formed on the surface of each of the first impurity regions.

6. The spin MOSFET according to claim 1, wherein the nonmagnetic layers of the first and second ferromagnetic stacked films are tunnel barriers.

7. The spin MOSFET according to claim 1, wherein at least one of the first and second ferromagnetic layers of each of the first and second ferromagnetic stacked films has a stacked structure comprising a first ferromagnetic sub-layer, a nonmagnetic sub-layer, and a second ferromagnetic sub-layer, an antiferromagnetic coupling being formed between the first and second ferromagnetic sub-layers.

8. The spin MOSFET according to claim 1, wherein the first and second ferromagnetic layers each have a magnetization easy axis direction perpendicular to a substrate plane of the substrate.

9. The spin MOSFET according to claim 1, wherein an antiferromagnetic layer is formed on each of the second ferromagnetic layers of the first and second ferromagnetic stacked films.

10. A reconfigurable logic circuit comprising a plurality of MOSFETs, at least one of the plurality of MOSFETs being the spin MOSFET according to claim 1.

11. The circuit according to claim 10, wherein film planes of the first and second ferromagnetic stacked films have different shapes from each other.

12. The circuit according to claim 10, wherein at least one of film planes of the first and second ferromagnetic stacked films has a line-asymmetric shape.

13. The circuit according to claim 10, wherein a tunnel barrier is formed between the semiconductor region and each of the first ferromagnetic layers of the first and second ferromagnetic stacked films.

14. The circuit according to claim 10, wherein: a first impurity region of a second conductivity type that is different from the first conductivity type is provided at each portion of the semiconductor region located below the first and second ferromagnetic stacked films; and a second impurity region of the second conductivity type having higher concentration than the first impurity region is formed on the surface of each of the first impurity regions.

15. The circuit according to claim 10, wherein the nonmagnetic layers of the first and second ferromagnetic stacked films are tunnel barriers.

16. The circuit according to claim 10, wherein at least one of the first and second ferromagnetic layers of each of the first and second ferromagnetic stacked films has a stacked structure comprising a first ferromagnetic sub-layer, a nonmagnetic sub-layer, and a second ferromagnetic sub-layer, an antiferromagnetic coupling being formed between the first and second ferromagnetic sub-layers.

17. The circuit according to claim 10, wherein the first and second ferromagnetic layers each have a magnetization easy axis direction perpendicular to a substrate plane of the substrate.

18. The circuit according to claim 10, wherein an antiferromagnetic layer is formed on each of the second ferromagnetic layers of the first and second ferromagnetic stacked films.

19. The spin MOSFET according to claim 1, wherein each of magnetization directions of the second ferromagnetic layers in the first and second ferromagnetic stacked films is unchangeable when the writing current is flowed between the first and second ferromagnetic stacked films via the portion of the semiconductor region.

20. The circuit according to claim 10, wherein each of magnetization directions of the second ferromagnetic layers in the first and second ferromagnetic stacked films is unchangeable when the writing current is flowed between the first and second ferromagnetic stacked films via the portion of the semiconductor region.

* * * * *